United States Patent [19]
Czarnul et al.

[11] Patent Number: 5,990,737
[45] Date of Patent: Nov. 23, 1999

[54] BALANCED AMPLIFIER USING SINGLE-ENDED OUTPUT OPERATIONAL AMPLIFIERS

[75] Inventors: Zdzislaw Czarnul, Yokohama; Hiroshi Tanimoto, Kawsaki; Tetsuro Itakura, Tokyo, all of Japan

[73] Assignee: Kabushiki Kaisha Toshiba, Kawasaki, Japan

[21] Appl. No.: 09/066,933

[22] Filed: Apr. 28, 1998

[30] Foreign Application Priority Data

Apr. 28, 1997 [JP] Japan .................................. 9-110944

[51] Int. Cl.[6] .......................................................... H03F 3/45
[52] U.S. Cl. .............................................. 330/69; 330/295
[58] Field of Search .................................. 330/69, 260, 258, 330/9, 295, 252

[56] References Cited

U.S. PATENT DOCUMENTS

| | | | |
|---|---|---|---|
| 3,623,140 | 11/1971 | Nercessian | 323/23 |
| 4,494,077 | 1/1985 | Fukaya et al. | 330/295 |
| 5,166,635 | 11/1992 | Shih | 330/253 |
| 5,796,301 | 8/1998 | Tanabe et al. | 330/9 |

OTHER PUBLICATIONS

M. Banu, et al. "Fully Differential Operational Amplifiers With Accurate Output Balancing", IEEE Journal of Solid–State Circuits, vol. 23, No. 6, Dec. 1988, pp. 1410–1414.

Primary Examiner—Robert Pascal
Assistant Examiner—Henry Choe
Attorney, Agent, or Firm—Oblon, Spivak, McClelland, Maier & Neustadt, P.C.

[57] ABSTRACT

A balanced amplifier includes first and second multi-input single-ended output differential amplifiers having matched characteristics and a feedback circuit. The feedback circuit connects differential input terminals and output terminals of the first and second multi-input single-ended output differential amplifiers so that all of the differential input terminals of the first and second multi-input single-ended output differential amplifiers are virtually shorted.

18 Claims, 11 Drawing Sheets

$K_D = K1 K2$
$K_C = K2 K3$

BALANCED AMPLIFIER USING SINGLE-ENDED OUTPUT OPERATIONAL AMPLIFIERS

BACKGROUND OF THE INVENTION

The present invention relates to a balanced amplifier and, more particularly, to a balanced amplifier using at least two single-ended output operational amplifiers.

Conventionally, analog circuits and digital circuits have been formed on different semiconductor chips. Recently, however, with the progress of integrated circuit technologies, it has become possible to realize so-called "system-on-chip" by which both analog and digital circuits are integrated on a single chip. Accordingly, it is being strongly demanded to develop means which protect the analog circuit portion which is sensitive to noise from interference from the digital circuit portion which generates large noise.

The simplest method by which this interference is reduced is to physically isolate the analog circuit portion and the digital circuit portion by dielectric isolation or by surrounding the two portions with a deep, broad isolation region. However, either method is economically unpreferable because the method complicates the fabrication process or increases the chip area. In addition, although these isolation measures can cut off low-frequency noise, as the speed of digital circuits has increased, it has become impossible to effectively cut off high-frequency noise due to coupling via the parasitic capacitance in the isolating portion.

As a circuital measure for solving this problem, the common-mode noise suppressing function of a balanced amplifier is again attracting attention. A balanced amplifier is an amplifier for amplifying a signal having a differential component and a common-mode component and has a function of suppressing the common-mode component and amplifying the differential component. A balanced amplifier itself has been known from the age of vacuum tubes and used in special applications such as a DC amplifier for handling microsignals generated from, e.g., an electrocardiograph and an electroencephalograph and a signal transmission system for industrial measurements.

In a system-on-chip, noise generated from the digital circuit portion affects the analog circuit portion via interconnections or a silicon substrate, and this noise is common-mode noise. Therefore, the common-mode noise can be efficiently suppressed by differentially transmitting signals by using a balanced amplifier. This method is expected to improve the dynamic range and increase the degree of suppression with respect to power supply variations.

To realize this method, in addition to a balanced amplifier by which satisfactory common-mode noise suppressing performance can be obtained up to frequencies as high as possible, a single ended-balanced converter and a balanced-single ended converter are necessary. The latter two converters are devices inserted before or after the balanced amplifier. The single ended-balanced converter converts a single-ended signal into a balanced signal, and the balanced-single ended converter converts a balanced signal into a single-ended signal. Since these converters can also be constituted by using balanced amplifiers, how to design balanced amplifiers is eventually the principal subject of circuit design.

FIG. 1A shows the principle of a typical method of implementing a conventionally proposed balanced amplifier. Balanced amplifiers of this sort are disclosed in Reference 1: K. R. Laker and W. M. C. Sansen, "Design of Analog Integrated Circuits and Systems", McGraw-Hill Inc., 1994 and Reference 2: M. Banu, J. Khoury and Y. P. Tsividis, "Fully differential operational amplifier with accurate output balance", IEEE Journal of Solid-state Circuits, vol. SC-23, no. 6, pp. 1410–1414, 1988.

This balanced amplifier includes a differential input differential output amplifier circuit 101, two adders 102 and 103, amplifier circuits 104 and 105, voltage-dividing means 109, and a differential amplifier circuit 108. The input signals $V_{i1}$ and $V_{i2}$ are applied to the differential amplifier circuit 101. Differential output signals from the differential amplifier circuit 101 are extracted as output signals $V_{o1}$ and $V_{o2}$ through the adders 102 and 103 and the amplifier circuits 104 and 105, respectively, and also applied to the two ends of the voltage-dividing means 109. A common-mode signal extracted from the voltage-dividing point is fed back to the input terminals of the amplifier circuits 104 and 105 through the differential amplifier circuit 108 and the adders 102 and 103, thereby canceling the common-mode signal component. This configuration is completely symmetrical in principle. Therefore, if the amplifier circuits 101, 104, 105 and 108 and the adders 102 and 103 are well matched, truly balanced operation can be expected up to very high frequencies. It is more important that truly balanced operation also requires K3→∞, and it is very difficult to realize at high frequencies.

FIG. 1B is a signal diagram of the balanced amplifier shown in FIG. 1A. In this signal diagram it is assumed that $K_D$=K1K2 and $K_C$=K2K3 hold. K1 is the gain of the differential amplifier circuit 101, K2 is the gain of the amplifier circuits 104 and 105, and K3 is the gain of the differential amplifier circuit 108.

According to References 1 and 2, to ensure the proper fully balanced operation over the interested frequency range the gain-bandwidth product GBWC of a common-mode signal path must be equal or larger than the gain-bandwidth product GBWP a differential-mode signal path. According to Reference 2, if the differential amplifier circuits 101 and 108 are very well matched, this condition is automatically met provided that the coefficients of the adders 102 and 103 are well matched.

Unfortunately, it is very difficult to meet this condition in circuits conventionally actually used because different circuit schematics are used as the amplifier circuit 101 in the differential signal path and the amplifier circuit 108 in the common-mode signal feedback path in FIG. 1A. For example, in Reference 2 the amplifier circuit 103 in the common-mode signal path has one additional current-mirror circuit compared to the amplifier circuit 101 in the differential signal path, and their circuit forms are also different. Since it is necessary to simultaneously optimize the characteristics of these amplifier circuits 101 and 108, several compromises must be made in designing these circuits, and this makes the design itself difficult (see Reference 1).

Reference 2 shows detailed and very sophisticated approaches to the design of a balanced amplifier which is considered to have the most excellent configuration at present, and to the compromises in the optimization. In these approaches, the common-mode signal of the output signals $V_{o1}$ and $V_{o2}$ is extracted from the voltage-dividing point of the voltage-dividing resistors 106 and 107 as shown in FIG. 1A and compared with a reference potential $V_{CMR}$. A negative feedback loop is constituted in such a way that the potential at the voltage-dividing point eventually equals the reference potential $V_{CMR}$.

In a configuration like this, however, the gain of the input differential transistor pair to the common-mode signal node is very large, so this initial stage is easily saturated. This is because the common-mode component of the output voltage from the initial stage is not directly controlled, i.e., the object of control is the potential at the voltage-dividing point. Therefore, it is difficult for this configuration even to realize stable DC operation unless the gain to the common-mode signal is kept very low. This poses the problem that the common-mode signal cannot be reliably rejected over the entire operating frequency band.

As described above, the conventional balanced amplifiers are difficult to design. In addition, if the symmetry between the differential signal path and the common-mode signal path is not saved with high accuracy, the common-mode signal cannot be reliably rejected.

It is an object of the present invention to provide a high-performance balanced amplifier capable of obtaining a high common-mode signal reject ratio CMRR over the entire operating frequency band.

BRIEF SUMMARY OF THE INVENTION

To achieve the above object, the present invention uses two matched amplifier circuits each using a single-ended output operational amplifier having two differential input terminal pairs and one output terminal. These differential input terminals are connected in a predetermined relationship to form four nodes. Negative feedback loops are formed from the output terminals of the two amplifier circuits to these nodes so that the differential input terminal pairs are simultaneously virtually shorted. In this manner the present invention realizes a balanced amplifier which allows easy connection and keeps very high symmetry between the differential signal path and the common-mode signal path.

A balanced amplifier according to the present invention primarily comprises a first amplifier circuit having first and second differential input terminal pairs and a first output terminal, and a second amplifier circuit having third and fourth differential input terminal pairs and a second output terminal. Individual terminals are connected as follows.

The inverting input terminal of the first differential input terminal pair and the non-inverting input terminal of the third differential input terminal pair are connected to form a first node, and a first input terminal is connected to this first node.

The non-inverting input terminal of the first differential input terminal pair and the inverting input terminal of the third differential input terminal pair are connected to form a second node, and a second input terminal is connected to this second node.

The non-inverting input terminal of the second differential input terminal pair and the non-inverting input terminal of the fourth differential input terminal pair are connected to form a third node.

The inverting input terminal of the second differential input terminal pair and the inverting input terminal of the fourth differential input terminal pair are connected to form a fourth node.

The balanced amplifier further comprises feedback means for performing feedback from the first and second output terminals to the first to fourth nodes so that all of the first to fourth differential input terminal pairs are virtually shorted.

Another balanced amplifier according to the present invention primarily comprises a first amplifier circuit having first and second differential input terminal pairs and a first output terminal, and a second amplifier circuit having third and fourth differential input terminal pairs and a second output terminal. Individual terminals are connected as follows.

The non-inverting terminals of the first and third differential input terminal pairs are connected to first and second input terminals.

The inverting input terminal of the second differential input terminal pair and the non-inverting input terminal of the fourth differential input terminal pair are connected to form a first node.

The non-inverting input terminal of the second differential input terminal pair and the inverting input terminal of the fourth differential input terminal pair are connected to form a second node.

The balanced amplifier further comprises first and second impedance elements connected in series between the first and second nodes, a third impedance element connected between the first node and the first output terminal, a fourth impedance element connected between the second node and the second output terminal, and a third amplifier circuit having an input terminal connected to the connecting point of the first and second impedance elements and an output terminal negatively fed back to the first and third inverting input terminals.

Still another balanced amplifier according to the present invention uses first and second single-ended output amplifier circuits each having three differential input terminal pairs and one output terminal. The output terminal of the first single-ended output amplifier is connected to a first output terminal. The output terminal of the second single-ended output amplifier is connected to a second output terminal. The non-inverting input terminal of a first differential input terminal pair of the first single-ended output amplifier circuit and the inverting input terminal of a first differential input terminal pair of the second single-ended output amplifier circuit are connected together to a first input terminal. The non-inverting input terminal of a first differential input terminal pair of the second single-ended output amplifier circuit and the inverting input terminal of the first differential input terminal pair of the first single-ended output amplifier circuit are connected together to a second input terminal. The non-inverting terminals of the second and third differential input terminal pairs of the first and second single-ended output amplifier circuits are connected together, and a predetermined voltage is applied. The inverting input terminals of the second differential input terminal pair of the first and second single-ended output amplifier circuits are connected together to the first output terminal of the amplifier circuit. The inverting input terminals of the third differential input terminal pairs of the first and second single-ended output amplifier circuits are connected together to the second output terminal of the amplifier circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B show a 4-input single-ended output differential amplifier, in which FIG. 3A is a symbol view and FIG. 3B is a signal diagram for explaining basic operation;

FIGS. 13A and 13B explain a 6-input single-ended output differential amplifier, in which FIG. 13A is a symbol view and FIG. 13B is a signal diagram for explaining basic operation;

FIGS. 19A and 19B show the arrangement of a filter using the balanced amplifier according to the present invention, in which FIG. 19A is an equivalent circuit diagram and FIG. 19B is a practical circuit diagram.

DETAILED DESCRIPTION OF THE INVENTION

Embodiments of the present invention will be described below.

(First Embodiment)

Figure 2:
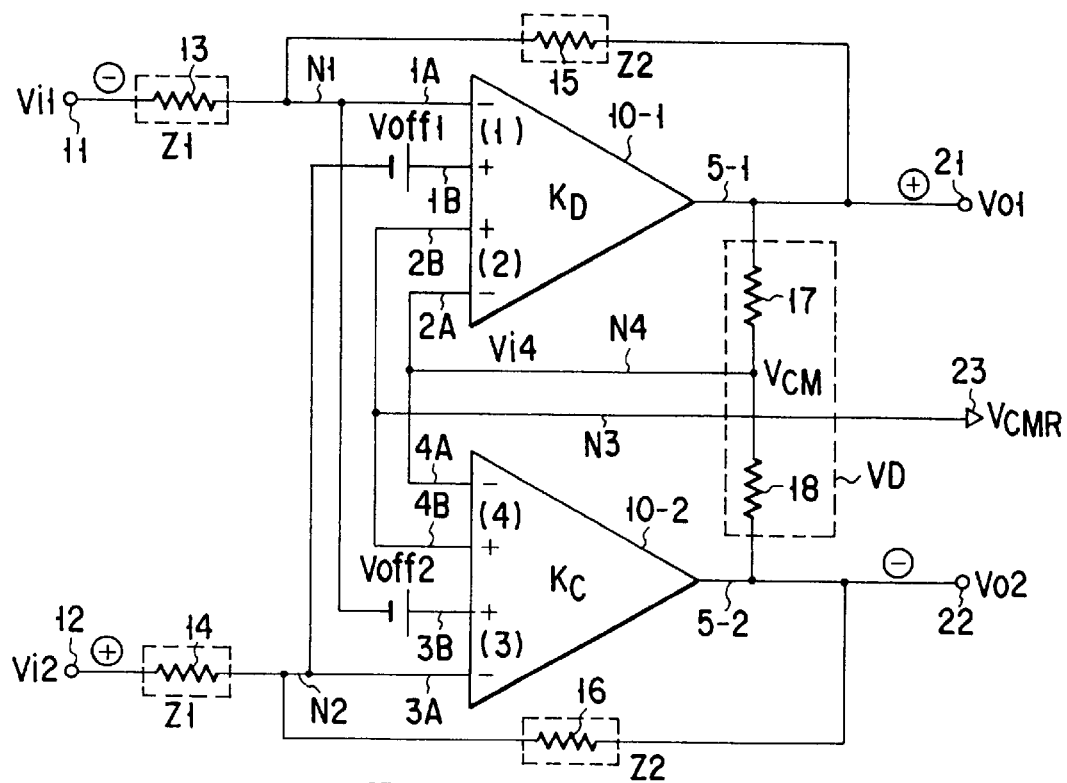
FIG. 2 is a circuit diagram showing the configuration of a balanced amplifier according to one embodiment of the present invention.

FIG. 2 shows the configuration of a balanced amplifier according to the first embodiment of the present invention.

First and second amplifier circuits 10-1 and 10-2 are 4-input single-ended output differential amplifiers each having two differential input terminal pairs and one output terminal. That is, the first amplifier circuit 10-1 has first and second differential input terminal pairs 1 and 2 and one output terminal 5-1. The second amplifier circuit 10-2 has third and fourth differential input terminal pairs 3 and 4 and a second output terminal 5-2.

The first differential input terminal pair 1 of the first amplifier circuit 10-1 is a first differential input terminal group. The second differential input terminal pair 2 of the first amplifier circuit 10-1 is a second differential input terminal group. Also, the second differential input terminal pair 2 of the first amplifier circuit 10-1 and the fourth differential input terminal pair 4 of the second amplifier circuit 10-2 form a third differential input terminal group.

Each of the differential input terminal pairs 1 to 4 has a pair of an inverting input terminal indicated by a reference numeral with suffix A and a non-inverting input terminal indicated by a reference numeral with suffix B.

An inverting input terminal 1A of the first differential input terminal pair 1 is connected to a non-inverting input terminal 3B of the third differential input terminal pair 3. This connecting point is a first node N1. This first node N1 is connected to a first input terminal 11 of the balanced amplifier via an input resistor 13. Similarly, a non-inverting input terminal 1B of the first differential input terminal pair 1 is connected to an inverting input terminal 3A of the third differential input terminal pair 3. This connecting point is a second node N2. This second node N2 is connected to a second input terminal 12 of the balanced amplifier via an input resistor 14.

A non-inverting input terminal 2B of the second differential input terminal pair 2 is connected to a non-inverting input terminal 4B of the fourth differential input terminal pair 4. This connecting point is a third node N3. Analogously, a inverting input terminal 2A of the second differential input terminal pair 2 is connected to an inverting input terminal 4A of the fourth differential input terminal pair 4. This connecting point is a fourth node N4.

The output terminals 5-1 and 5-2 of the first and second amplifier circuits 10-1 and 10-2 are connected to first and second output terminals 21 and 22, respectively, of the balanced amplifier.

Feedback is performed from the output terminals 5-1 (21) and 5-2 (22) to the nodes N1 to N4 so that each of the first to fourth differential input terminal pairs 1 to 4 is virtually shorted. This feedback is done by a first feedback circuit for performing feedback from the output terminals 5-1 and 5-2 to the first and second nodes N1 and N2 and a second feedback circuit for performing feedback from the output terminals 5-1 and 5-2 to the third and fourth nodes N3 and N4.

In this embodiment, the first feedback circuit is constituted by a feedback impedance element 15 connected between the output terminal 5-1 and the node N1 and a feedback impedance element 16 connected between the output terminal 5-2 and the node N2, thereby forming a feedback loop. The feedback factor is determined by the ratio of the resistance of the input impedance elements 13 and 14 to the resistance of the feedback impedance elements 15 and 16. A feedback element can be basically any element as long as it is an impedance element. In FIG. 2, resistors are used as an impedance element.

The second feedback circuit is constituted by two voltage-dividing means VD connected in series between the output terminals 5-1 and 5-2. The voltage-dividing means is realized by two resistors 17 and 18. The connecting point of these resistors 17 and 18 is connected to the node N4. Note that the third node N3 is connected to a reference potential point 23 having a fixed reference potential VCMR.

Figure 3A:
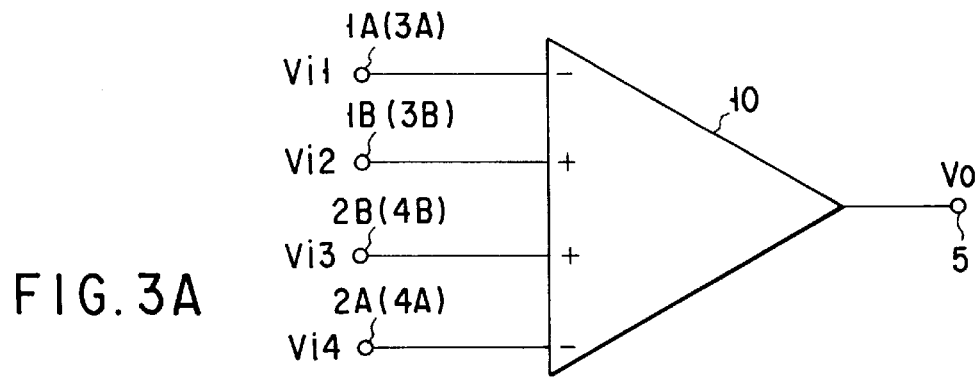
Figure 3B:
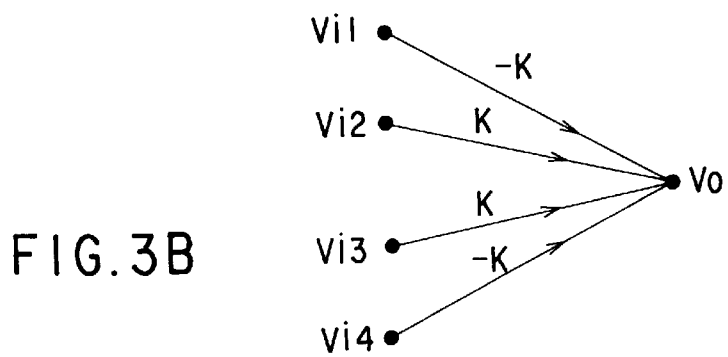

FIGS. 3A and 3B are a symbol view and a signal diagram (signal flow graph), respectively, of a single-ended output differential amplifier 10. This single-ended output differential amplifier can be expressed by basic relation (1) of a four input amplifier and the following additional relations:

$$V_{i2}(s) - V_{i1}(s) \xrightarrow{K(s)\to\infty} 0 \qquad (3)$$

$$V_{i3}(s) - V_{i4}(s) \xrightarrow{K(s)\to\infty} 0 \qquad (4)$$

Noted that a single-ended output differential amplifier must be used in a system configuration which satisfies both of relations (3) and (4). As in the case of an ordinary operational amplifier, any single-ended output differential amplifier must always be used in a negative feedback configuration in order to limit an output voltage $V_o$.

Figure 4:
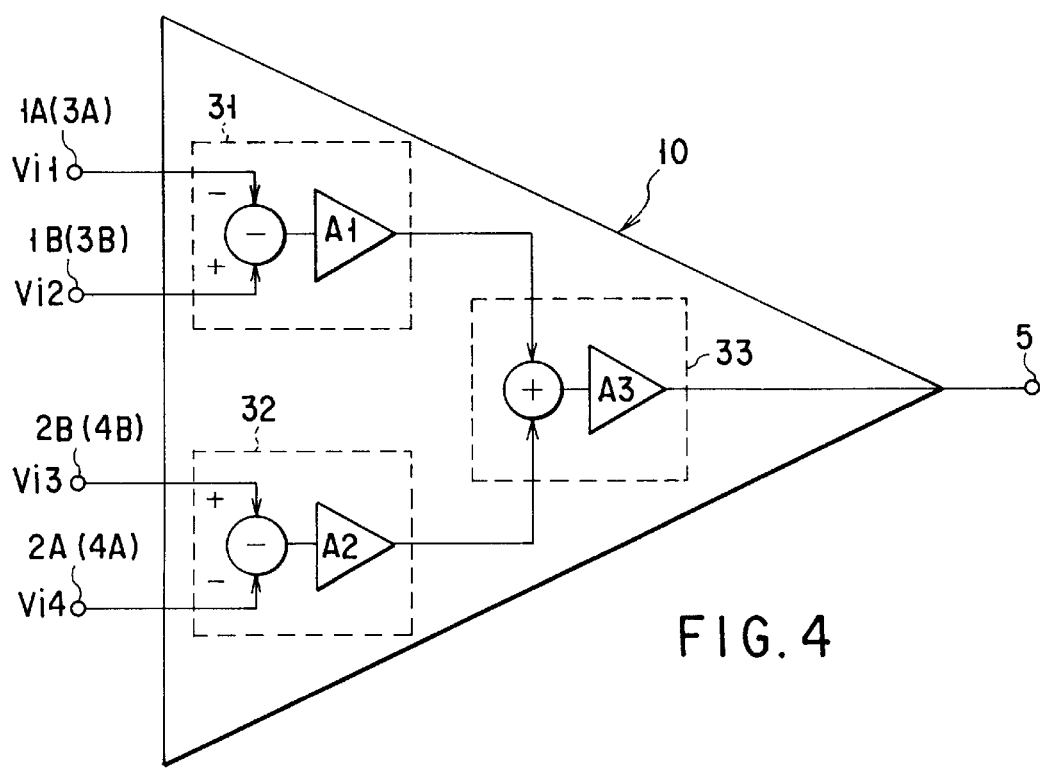
FIG. 4 is a view showing the principle of one example of the 4-input single-ended output differential amplifier.

FIG. 4 shows an example of the single-ended output differential amplifier 10. This amplifier includes a first amplifier unit 31, a second amplifier unit 32, and a third amplifier unit 33. The first amplifier unit 31 amplifies a difference signal from a first differential input terminal pair (or a third differential input terminal pair), i.e., a difference signal between an inverting input terminal 1A (3A) and a non-inverting input terminal 1B (3B). The second amplifier unit 32 amplifies a difference signal from a second differential input terminal pair (or a fourth differential input terminal pair), i.e., a difference signal between an inventing input terminal 2A (4A) and a non-inverting input terminal 2B (4B). The third amplifier unit 33 amplifies a sum signal of outputs from the first and second amplifier units 31 and 32.

Letting A1, A2, and A3 be the gains of the first, second, and third amplifiers 31, 32, and 33, respectively, the output from this single-ended output differential amplifier is A3{A1(V$_{i2}$-V$_{i1}$)+A2(V$_{i3}$-V$_{i4}$)}. The relationship with FIG. 3B is A1A3=A2A3=K.

This embodiment can realize a balanced amplifier which satisfies both of relations (3) and (4) as described below. By comparing in detail the signal diagram shown in FIG. 3B and a signal diagram shown in FIG. 11B of a conventional balanced amplifier, the stable operation condition $K_D=K_C=K$ shown in FIG. 1B can be accomplished by using the two matched amplifier circuits 10-1 and 10-2 and the feedback circuits as shown in FIG. 2. That is, a balanced amplifier can be realized by using two matched 4-input single-ended operational amplifiers.

Assuming that K has a large value, and given the fact that the output voltages $V_{o1}$ and $V_{o2}$ from the amplifier circuits 10-1 and 10-2 have finite values, the differential input voltage must satisfy $$-V_{i1}+V_{i2}-V_{i4}+V_{CMR} \to 0 (K\to\infty) \qquad (5)$$

$$V_{i1}-V_{i2}-V_{i4}+V_{CMR} \to 0 (K\to\infty) \qquad (6)$$

The third node N3 is connected to the reference potential point 23, i.e., $V_{CMR}$. Assuming that the voltage-dividing ratio of the voltage-dividing resistors 17 and 18 is unity (the values of the resistors 17 and 18 are equal), from relations (5) and (6) we obtain $$V_{i2}-V_{i1} \to 0 (K\to\infty) \qquad (7)$$

$$V_{i4} = \frac{V_{o1} + V_{o2}}{2} \to V_{CMR}(K\to\infty) \qquad (8)$$

Evidently, from relations (7) and (8), in the configuration shown in FIG. 2 all of the differential input terminal pairs 1, 2, 3, and 4 are virtually shorted to satisfy the basic conditions for realizing a balanced amplifier.

The balanced amplifier of this embodiment also has the advantage that this balanced amplifier can be readily designed by the following method.

(Step S1)

Figure 6:
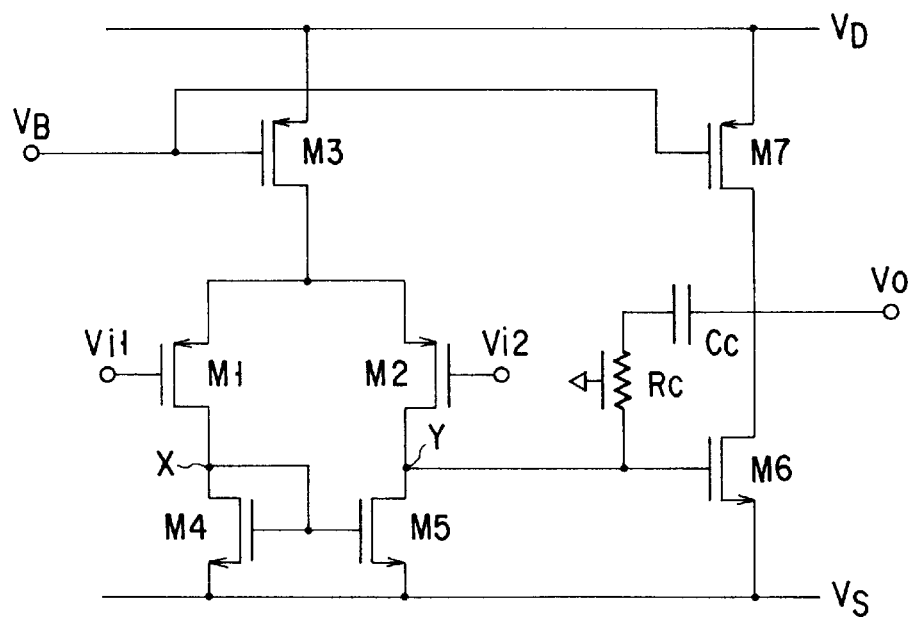
FIG. 6 is a circuit diagram of an ordinary single-ended operational amplifier.

A single-ended operational amplifier (OPAMP) is designed, or an appropriate operational amplifier already designed is selected. FIG. 6 shows a circuit example of such an operational amplifier. In this operational amplifier, a pair of differential transistors M1 and M2 are arranged in the initial stage (input stage). The common source of the differential transistors M1 and M2 is connected to a bias current source using a transistor M3. The drains of the differential transistors M1 and M2 are connected to a current-mirror circuit including transistors M4 and M5. An output terminal Y of the initial stage is connected to an output terminal via an output stage including a transistor M6 constituting a source-grounded amplifier circuit and a bias current source using a transistor M7 as a load of the transistor M6. $R_c$ and $C_c$ are a resistor and a capacitor, respectively, for phase compensation.

(Step S2)

Figure 7:
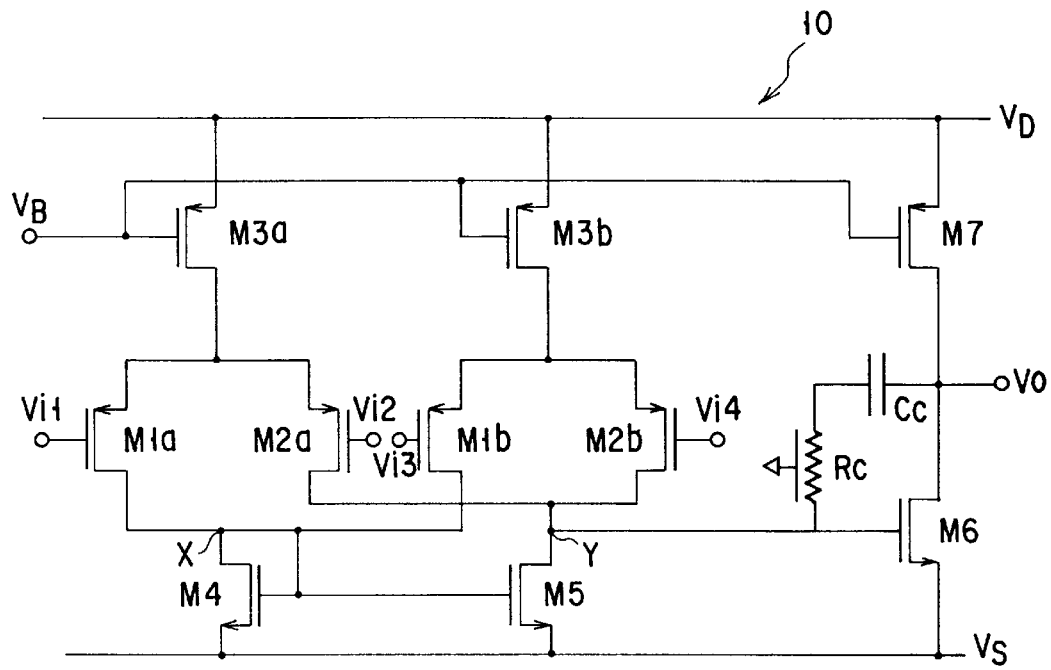
FIG. 7 is a circuit diagram showing a 4-input single-ended output differential amplifier that uses ordinary single-ended operational amplifiers.

To design a 4-input operational amplifier (single-ended output differential amplifier), the differential transistors M1 and M2 and the bias current source M3 in the initial stage of the operational amplifier designed or chosen in step S1 are divided into two matched portions as shown in FIG. 7. That is, the input stage of an amplifier circuit shown in FIG. 7 has a first differential amplifier circuit including a pair of differential transistors M1a and M2a and a bias current source using a transistor M3a and a second differential amplifier circuit including a pair of differential transistors M1b and M2b and a bias current source using a transistor M3b. In this input stage, output terminals (the drains of M1a and M1b) at one end of the first and second differential amplifier circuits are connected in parallel at a node X. Output terminals (the drains of M2a and M2b) at the other end of the first and second differential amplifier circuits are connected in parallel at a node Y. As in FIG. 6, the node Y is connected to an output terminal via an output stage including a transistor M6 and a bias current source using a transistor M7 as a load of the transistor M6. The configuration of this amplifier circuit is equivalent to a case in which A1=A2=1 and A3=K in FIG. 4.

Figure 8:
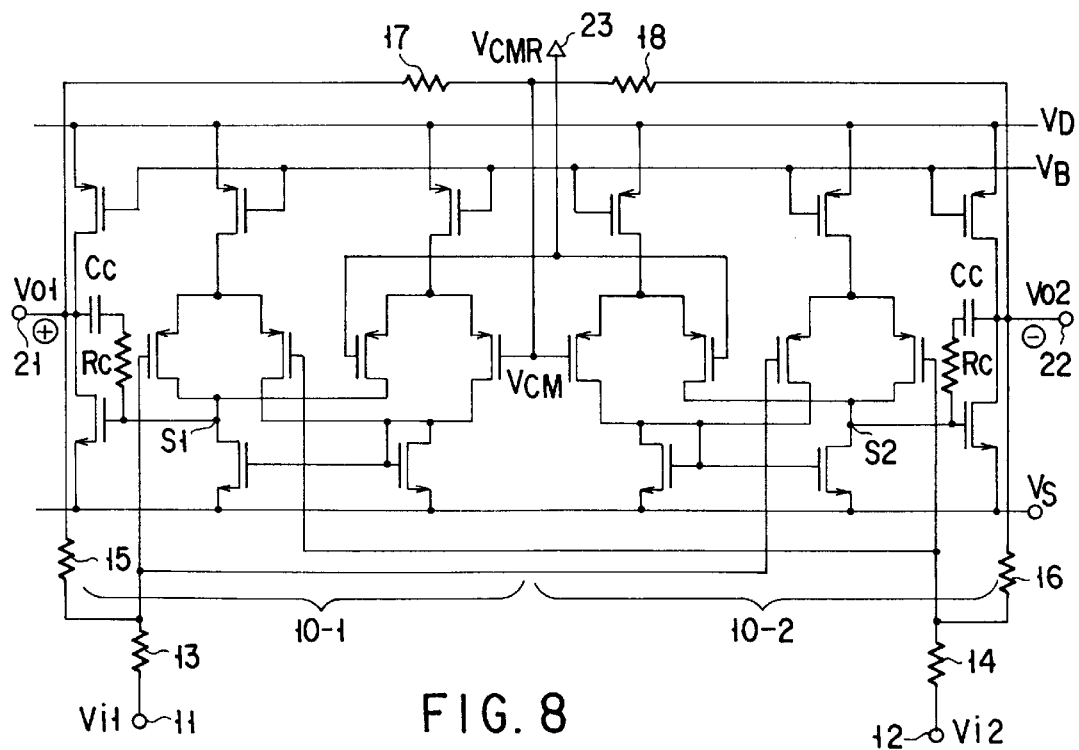
FIG. 8 is a circuit diagram showing the first practical example of the balanced amplifier according to the same embodiment.

Note that if the gate width/gate length ratio of the transistors M1 and M2 is W/L and the current value of the transistor M3 is I in FIG. 7, the gate width/gate length ratio of the transistors M1a, M1b, M2a, and M2b is (W/L)/2 and the current value of the transistors M3a and M3b is ½ in FIG. 8.

(Step S3)

Two single-ended output differential amplifiers shown in FIG. 7 designed in step S2 and having equal characteristics, i.e., matched to each other are prepared and connected as shown in FIG. 8. In addition, input resistors 13 and 14, feedback resistors 15 and 16, and voltage-dividing resistors 17 and 18 are connected to complete the balanced amplifier. The configuration shown in FIG. 8 is a practical example of the balanced amplifier according to this embodiment shown in the circuit diagram of FIG. 2.

In FIG. 8 the first differential amplifier circuit having the input voltages $V_{i1}$ and $V_{i2}$ and the second differential amplifier circuit having the input voltages $V_{CM}$ and $V_{CMR}$ are completely identical (=matched) and have ordinary summing nodes S1 and S2. Therefore, the characteristics of this balanced amplifier with respect to a differential signal and a common-mode signal are automatically matched. This property leads to the following conclusions.

(1) A single-ended operational amplifier with any circuit configuration can be converted into a balanced amplifier following the procedures in steps S1 to S3 described above.

(2) Unlike the circuit configuration disclosed in Reference 2, the present invention has no extra items to be taken into consideration.

(3) The conditions (see Reference 2 and p. 603 of Reference 1) required for a common-mode signal amplifier circuit to properly operate are automatically met provided that all elements to be symmetrical are well matched in the circuit configuration of the present invention.

In an application in which the gain-bandwidth product $GBW_C$ of the common-mode signal path must be much larger than the gain-bandwidth product $GBW_D$ of the differential signal path, however, it is necessary to increase the gate width (W) of the transistors constituting the two central transistor pairs used for common-mode signal feedback in FIG. 8. When the single-ended operational amplifier as shown in FIG. 6 as a prototype is well optimized, the gate width W of the transistors constituting the two differential transistor pairs on the two sides shown in FIG. 8 used in the main differential signal path must be decreased in order to maintain the total gain constant.

Although some adjustments as described above are sometimes necessary, the simplicity of design of the balanced amplifier according to the present invention is almost the same as that of conventional single-ended operational amplifiers. The circuit can be readily optimized, where necessary, in terms of low-voltage operation, output swing, rail-to-rail operation, constant gm, and the like in the initial stages of design, i.e., in the stages of designing the single-ended operational amplifier as a prototype. The obtained properties are handed over to a finally obtained balanced amplifier.

Figure 9:
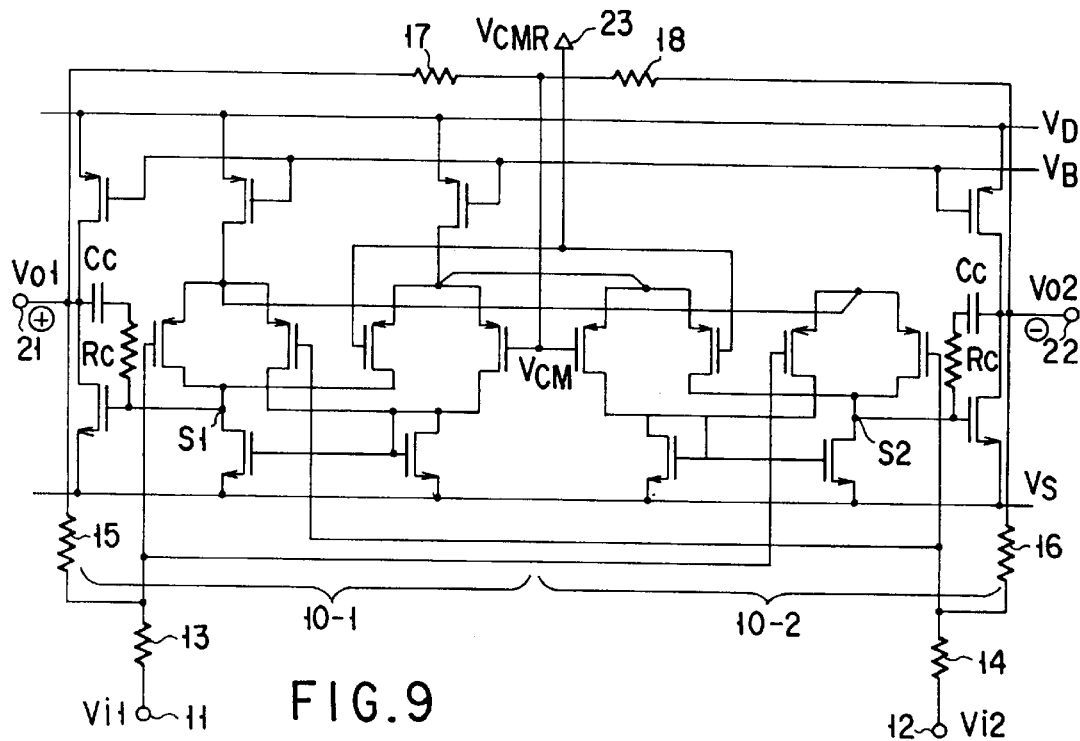
FIG. 9 is a circuit diagram showing the second practical example of the balanced amplifier according to the same embodiment.

Additionally, in the present invention the circuit can be modified as follows in order to alleviate the problem of matching. For example, as shown in FIG. 9, the common sources of two differential transistor pairs in the common-mode signal path are shorted, and the common sources of two differential transistor pairs in the differential signal path are shorted. Consequently, the number of bias current sources is reduced from four to two, i.e., the number of elements contributing to the matching is reduced. This improves offset and noise and makes the circuit robust against fabrication variations. Other modifications are of course possible.

When the corresponding differential transistor pairs and output stages are respectively well matched in the circuit shown in FIGS. 8 or 9, the operation of the circuit becomes equivalent to the idealized signal diagram shown in FIG. 3B. However, the design and operation of the circuit are far easier than those disclosed in References 1 and 2 and natural.

Figure 5:
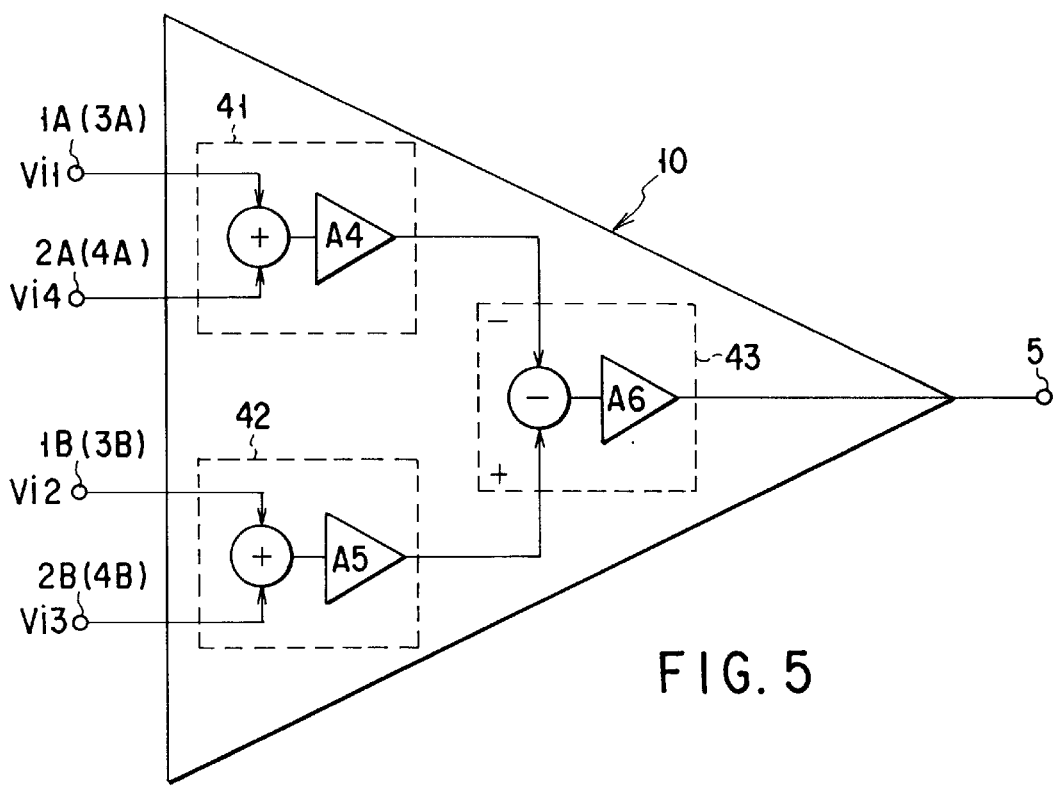
FIG. 5 is a view showing the principle of another example of the 4-input single-ended output differential amplifier.

Furthermore, the single-ended output differential amplifier used in the present invention can also be expressed as shown in FIG. 5. This amplifier includes a first amplifier unit 41, a second amplifier unit 42, and a third amplifier unit 43. The first amplifier unit 41 amplifies a sum signal of an inverting input terminal 1A (3A) of a first differential input terminal pair (or a third differential input terminal pair) and an inverting input terminal 2A (4A) of a second differential input terminal pair (or a fourth differential input terminal pair). The second amplifier unit 42 amplifies a sum signal of a common-mode input terminal 1B (3B) of the first differential input terminal pair (or the third differential input terminal pair) and a common-mode input terminal 2B (4B) of the second differential input terminal pair (or the fourth differential input terminal pair). The third amplifier unit 43 amplifies a difference signal of outputs from the first and second amplifier units 41 and 42.

Let A4, A5, and A6 be the gains of the first, second, and third amplifier units 41, 42, and 43, respectively. Then, the output from this single-ended output differential amplifier is $A6\{-A4(V_{i1}+V_{i4})+A5(V_{i2}+V_{i3})\}$. Assuming that $A4A6=A5A6=K$, a balanced amplifier satisfying both of relations (3) and (4) can be realized as in the example shown in FIG. 4.

In this single-ended output differential amplifier, amplifier circuits having a summing function are arranged in the input stage. This type of amplifier can be realized by using a CMOS transconductor circuit described in, e.g., Reference 4: Zdzislaw Czarnul, Tetsuya Iida and Kazuhiro Tsuji, "A Low-Voltage Highly Linear Multiple Weighted Input CMOS Transconductor", IEEE TRANSACTIONS ON CIRCUITS AND SYSTEMS-II: ANALOG AND SIGNAL PROCESSING, VOL. 42, No. 5, MAY 1955 (particularly FIG.(a)(b)).

The balanced amplifier according to this embodiment shown in FIG. 2 constitutes an inverting amplifier, and its differential transfer function is given by $$V_{o1}(s) - V_{o2}(s) = -\frac{Z_2(s)}{Z_1(s)} \frac{1}{1+\frac{\mu(s)}{2}\left\{1+\frac{Z_2(s)}{Z_1(s)}\right\}} \{V_{i1}(s) - V_{i2}(s)\} + \quad (9)$$

$$\frac{Z_1(s)+Z_2(s)}{2Z_1(s)+\mu\{Z_1(s)+Z_2(s)\}}(V_{off1}-V_{off2}) \xrightarrow{\mu \to 0}$$

$$-\frac{Z_2(s)}{Z_1(s)}\{V_{i1}(s)-V_{i2}(s)\} + \frac{1}{2}\left\{1+\frac{Z_2(s)}{Z_1(s)}\right\}(V_{off1}-V_{off2})$$

where $Z_1$ denotes the impedance of the impedance elements 13 and 14, and $Z_2$ denotes the impedance of the impedance elements 15 and 16.

From FIG. 2, $K_D(s)=K(s)=1/\mu(s)$ is a transfer function from the input of the first differential input terminal pair 1 to the output $V_{o1}$ of the first output terminal 21. This transfer function is assumed equal to a transfer function from the input of the second differential input terminal pair 2 to the output $V_{o2}$ of the second output terminal 22. $V_{off1}$ and $V_{off2}$ are offsets.

Relation (9) shows that the differential output voltage from the output terminals 21 and 22 includes $-Z_2/Z_1$ times the differential input voltage to the input terminals 11 and 12 and $\frac{1}{2}(1+Z_2/Z_1)$ times the difference between the offset voltages as an error. That is, the configuration of this embodiment performs the same operation as when an inverting amplifier circuit uses ordinary single-ended operational amplifiers.

Additionally, if $K_C(s)=K(s)=1/\mu(s)$ is a transfer function from the input of the differential input terminal pair 1 to the output $V_{o1}$ and is also a transfer function from the input of the differential input terminal 2 to the output $V_{o2}$, a common-mode output voltage $V_{CM}=(V_{o1}+V_{o2})/2$ defined with respect to the given reference potential $V_{CMR}$ is represented by $$\frac{V_{o1}(s) + V_{o2}(s)}{2} - V_{CMR} = \frac{1}{2} \frac{K_D(s)}{1 + K_C(s)} (V_{off1} + V_{off2}) \quad (10)$$

$$= \frac{1}{2} \frac{1}{\mu + \frac{K_C}{K_D}} (V_{off1} + V_{off2})$$

$$\xrightarrow[\mu \to 0]{} \frac{1}{2} (V_{off1} + V_{off2})$$

Accordingly, the error of the common-mode output voltage $V_{CM}=(V_{o1}+V_{o2})/2$ depends only upon the sum $V_{off1}+V_{off2}$ of the offset voltages, not upon the common-mode input voltage $(V_{i1}+V_{i2})/2$. That is, very high common-mode signal suppressing performance can be obtained by the arrangement of this embodiment.

In the present invention as described above, modifications of many operational amplifiers, e.g., an operational amplifier whose transconductance gm is constant regardless of the common-mode voltage, a rail-to-rail input or output operational amplifier, and an operational amplifier having a cascode output stage can be accomplished for actual applications.

Generally, a converter which converts a normally used single-ended signal into a balanced signal based on a predetermined reference voltage $V_{CMR}$, i.e., a so-called SEBE converter is necessary immediately before a balanced system such as a balanced amplifier. Methods of realizing two types of SEBE converters have been conventionally proposed. One is a SEBE converter using a balanced operational amplifier (Reference 5: J. J. Haspelagh, D. Sallaerts, P. P. Rcusens, A. Van Welsenaers, R. Granek and D. Rabaey, "A 270-kb/s 35-mW modulator IC for GSM celluar radio hand-held terminals", IEEE J.S.S.C., Vol. SC-25, pp. 1450–1457, Dec. 1990). The other is a SEBE converter using a balanced DDA (Reference 6: J. F. Duque-Carrilo, G. Torelli, R. Perez-Aloe, J. M. Vaverde and F. Maloberti, "Fully Differential Basic Building Blocks on Fully Differential Amplifiers with Unity-Gain Difference Feedback", IEEE Trans. Circ. and Syst.-I: Fundamental Theory and Applications, Vol. 42, pp. 190–192, 1995, particularly FIG. 4(a)(b)). The both converts can be realized on the basis of a balanced amplifier.

(Second Embodiment)

Figure 10:
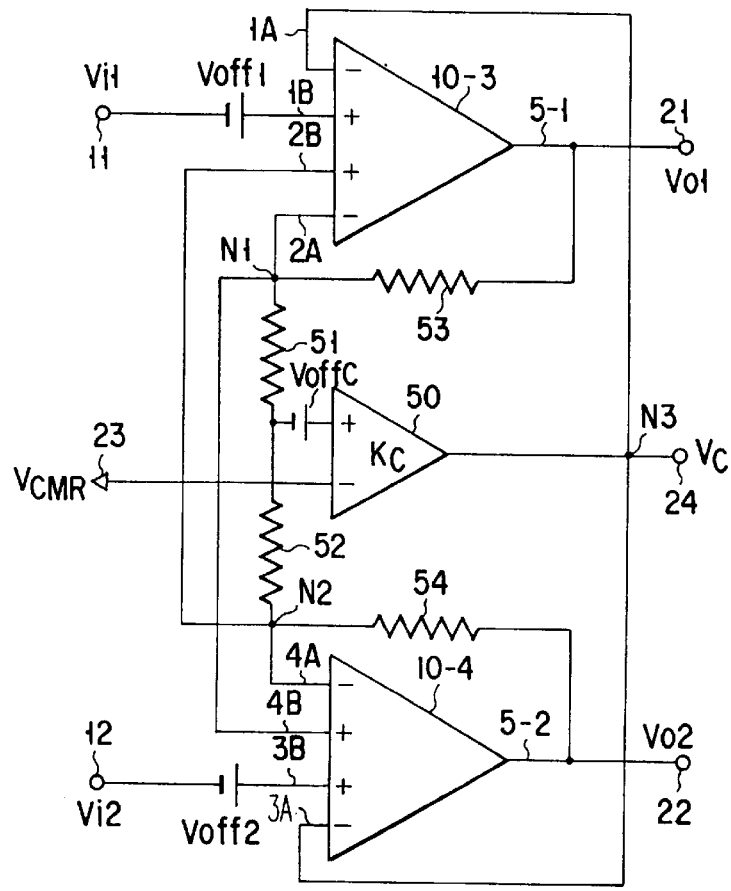
FIG. 10 is a circuit diagram of a SEBE converter as a balanced amplifier according to another embodiment of the present invention.

As the second embodiment of the present invention, FIG. 10 shows a novel SEBE converter using a balanced non-inverting amplifier based on a single-ended output differential amplifier. This SEBE converter is primarily constituted by first and second amplifier circuits 10-3 and 10-4 which are 4-input single-ended output differential amplifiers such as used in the first embodiment and an operational amplifier 40. The circuit is vertically, completely symmetrical. Both of the first and second amplifier circuits 10-3 and 10-4 operate in a balanced mode.

The first amplifier circuit 10-3 has first and second differential input terminal pairs and a first output terminal 5-1. The second amplifier circuit 10-4 has third and fourth differential input terminal pairs and a second output terminal 5-2.

Non-inverting input terminals 1B and 3B of the first and third differential input terminal pairs are connected to first and second input terminals 11 and 12, respectively. An inverting input terminal 2A of the second differential input terminal pair is connected to a non-inverting input terminal 4B of the fourth differential input terminal pair. This connecting point is a first node N1. Also, a non-inverting input terminal 2B of the second differential input terminal pair is connected to an inverting input terminal 4A of the fourth differential input terminal pair. This connecting point is a second node N2.

First and second resistors 51 and 52 are connected in series between the first and second nodes N1 and N2. A third resistor 53 is connected between the first node N1 and a first output terminal 21 as the output terminal of the first amplifier circuit 10-3. A fourth resistor 54 is connected between the second node N2 and a second output terminal 22 as the output terminal of the second amplifier circuit 10-4.

The connecting point between the resistors 51 and 52 is connected to the non-inverting input terminal of an operational amplifier 50. The inverting input terminal of this operational amplifier 50 is connected to a reference potential point 23 having a predetermined reference potential $V_{CMR}$. The output terminal of the operational amplifier 50 is connected to a third output terminal 24 and negatively fed back to inverting input terminals 1A and 3A of the first and third differential input terminal pairs.

Assume that an output voltage $V_o(s)$ from the first and second amplifier circuits 10-3 and 10-4 using single-ended output differential amplifiers in this embodiment can be expressed as $$V_o(s) = F[V_{i1}(s) - V_{i2}(s), V_{i4}(s) - V_{i3}(s)] \quad (11)$$

Assume also that a function $F(V_x, V_y)$ satisfies the fundamental relation $$F(V_x, V_y) = -F(-V_x, -V_y) \quad (12)$$

In the configuration of this embodiment, an output voltage $V_C=(V_{o1}+V_{o2})/2-V_{CMR}$ of the operational amplifier 50 approaches zero if the gain of the operational amplifier 50 is large. This voltage $V_C$ can also be expressed as $$V_{o1} + V_{o2} - 2V_{CMR} = F[V_{i1}(s) - V_c(s), V_c(s), V_{o2}(s) - V_{o1}(s)] + \quad (13)$$

$$F[V_{i2}(s) - V_c(s), V_{o2}(s) - V_{o1}(s)] \xrightarrow[K_c \to \infty]{} 0$$

The above relation means $$V_c(s) \to \frac{V_{i1} + V_{i2}}{2} \quad (14)$$

As a consequence, the differential input voltage to the first and second differential input terminals of the first amplifier circuit 10-3 is given by $$V_{id1A}(s) = \frac{V_{i1} - V_{i2}}{2}; V_{id2A}(s) = -\frac{V_{o1} - V_{o2}}{2} \quad (15)$$

Analogously, the differential input voltage to the third and fourth differential input terminal pairs of the second amplifier circuit is given by $$V_{id1B}(s) = \frac{V_{i1} - V_{i2}}{2}; V_{id2B}(s) = -\frac{V_{o1} - V_{o2}}{2} \quad (16)$$

As described above, all corresponding differential input voltages in the circuit shown in FIG. 10 are antisymmetric. Assuming that the amplifier circuits 10-3 and 10-4 have a high gain, $V_{id1A}+V_{id2A} \to 0$ and $V_{id1B}+V_{id2B} \to 0$. Accordingly, the differential output voltage from between the output terminals 21 and 22 can be written as $$V_{o1}(s) - V_{o2}(s) \to V_{i1}(s) - V_{i2}(s) \quad (17)$$

The operation of the first and second amplifier circuits 10-3 and 10-4 using single-ended output differential amplifiers is similar to that of a unity-gain buffer using a conventional operational amplifier, and this unity-gain buffer must operate over a gain-bandwidth product (GBW). In a unity-gain buffer, the input voltage is applied to the non-inverting input terminal of an operational amplifier, and the output voltage is fed back to the inverting input terminal of the operational amplifier. Similarly, in the SEBE converter according to this embodiment, a half $(V_{i1}-V_{i2})/2$ of the differential input voltage is applied to one differential input terminal of a single-ended output differential amplifier, and a half $(V_{o1}-V_{o2})/2$ of the differential output voltage is fed back and applied in reverse phase to the second differential input terminal of the single-ended output differential amplifier.

In effect, even when the input stage of the single-ended output differential amplifier uses, e.g., a single nonlinear differential transistor pair, the whole converter can operate as a high-linearity, high-frequency SEBE converter with respect to relatively large differential input voltages $V_{i1}$ and $V_{i2}$.

Also, the circuit of this embodiment obviously operates as a balanced-single ended converter by extracting one of the output voltages Vo1 and Vo2 when the differential input voltages Vi1 and Vi2 are applied.

To demonstrate that this system is DC-stabilized even in the presence of offset, assume that the first and second amplifier circuits 10-3 and 10-4 using single-ended output differential amplifiers are linear. Differential and common-mode output voltages are obtained from the output voltages of these amplifier circuits 10-3 and 10-4 and can be written as $$V_{o1}(s) - V_{o2}(s) = \frac{V_{i1}(s) - V_{i2}(s) + V_{off1}(s) - V_{off2}(s)}{\mu(s) + 2} \quad (18)$$

$$V_{o1}(s) + V_{o2}(s) = \frac{V_{i1}(s) + V_{i2}(s) + V_{off1}(s) + V_{off2}(s)}{\mu(s) + K_c(s)} + \frac{V_{offc}}{\frac{\mu(s)}{K_c(s)} + 1} \quad (19)$$

In the above relations, the gain of the amplifier circuits 10-3 and 10-4 is $1/\mu$, the gain of the operational amplifier 50 is $K_c$, and $V_{off1}$, $V_{off2}$, and $V_{offc}$ are offsets of the amplifier circuits 10-3 and 10-4 and the operational amplifier 50, respectively.

The output voltage of the operational amplifier 50 is expressed by $$V_c(s) = \frac{1}{2}\left[\frac{V_{i1}(s) + V_{i2}(s) + V_{off1}(s) + V_{off2}(s)}{\frac{\mu(s)}{K_c(s)} + 1} + \frac{V_{offc}}{\frac{1}{K_c(s)} + \frac{1}{\mu(s)}}\right] \quad (20)$$

Relations (18), (19), and (20) show that all DC outputs of the system are stabilized. The output voltage $V_c=(V_{i1}+V_{i2})/2$ of the operational amplifier 50 is sometimes necessary in realizing a certain kind of an analog signal processing system. However, this can be directly used in the SEBE converter of this embodiment. For example, a square difference operation $V_{i12}-V_{i22}=(V_{i1}-V_{i2})(V_{i1}+V_{i2})$ often used in analog signal processing can be realized by simply adding a multiplier to the output of the SEBE converter of this embodiment.

In the above embodiment, ordinary fixed resistors are used as the voltage-dividing elements and the feedback elements. However, these elements can also be accomplished by using, e.g., variable resistors using MOSFETs. In some instances, reactance elements such as capacitors or coils can also be used. In short, any impedance element corresponding to the purpose or application of a balanced amplifier can be used.

(Third Embodiment)

Figure 11:
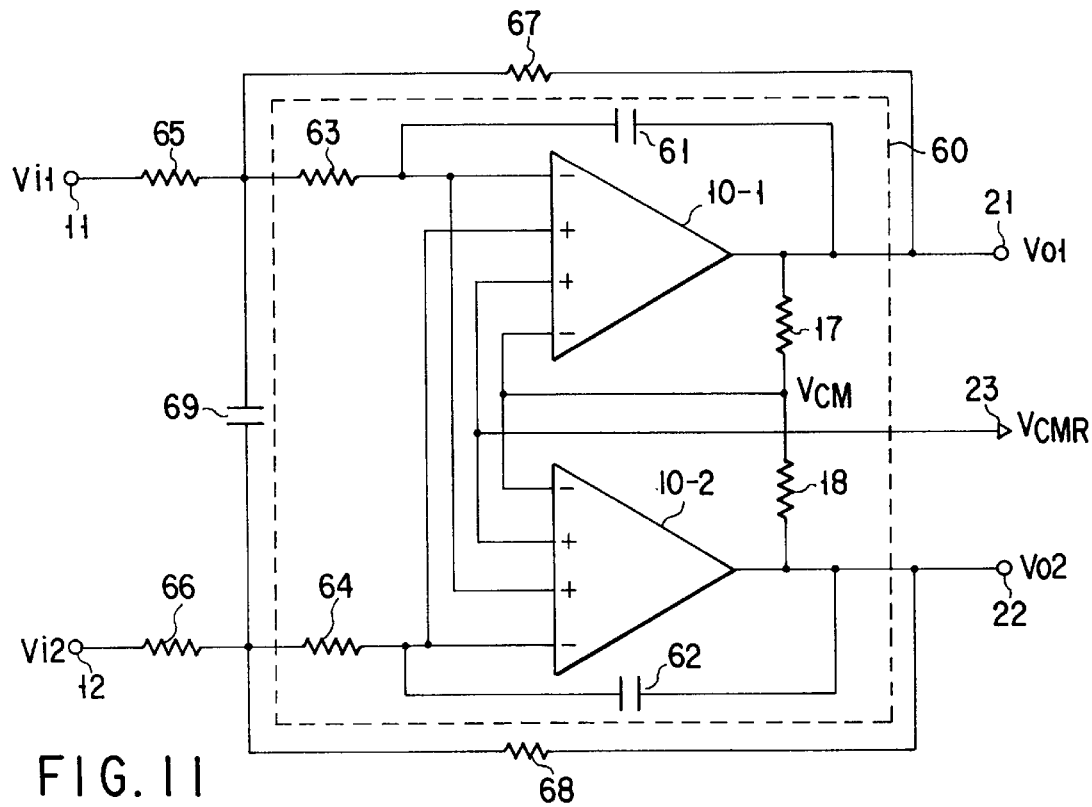
FIG. 11 is a circuit diagram showing the arrangement of a filter using the balanced amplifier according to the present invention.

FIG. 11 shows the fifth embodiment in which a balanced amplifier according to the present invention is applied to a filter. This filter is a balanced version of a well-known multifeedback low-pass filter and uses the balanced amplifier according to the present invention as an amplifier. With this balanced low-pass filter arrangement, it is possible to realize a filter not easily affected by noise mixing via a power supply or noise mixing via a semiconductor substrate. Additionally, even when the input and output stages have different common-mode voltages, desired filter characteristics can be obtained regardless of the difference between these common-mode voltages.

The filter of this embodiment is practically a second-order low-pass filter in which integrating capacitors 61 and 62 are used instead of the feedback resistors 15 and 16 shown in FIG. 2. These integrating capacitors 61 and 62, integrating resistors 63 and 64, amplifier circuits 10-1 and 10-2, and voltage-dividing resistors 17 and 18 constitute a balanced integrator. Integrating resistors 65 and 66 also serving as input resistors are inserted between the integrating resistors 63 and 64 and input terminals 11 and 12. Negative feedback is performed from output terminals 21 and 22 to the connecting point of the resistors 63 and 65 and the connecting point of the resistors 64 and 66 via feedback resistors 67 and 68, respectively. In addition, another integrating capacitor 69 is connected between the connecting point of the resistors 63 and 65 and the connecting point of the resistors 64 and 66.

As in the case of an ordinary single-ended integrator, it is of course possible by connecting a plurality of balanced integrators 60 to realize various integrator-based filters such as a state-variable filter and a leapfrog filter.

In the above embodiment, a MOSFET is used as an element constituting the single-ended prototype operational amplifier. However, the active element constituting the single-ended operational amplifier is not limited to a MOSFET. That is, it is possible to apply any element, such as a bipolar transistor, a junction FET, a gallium-arsenic MESFET, or a vacuum tube, capable of constituting a single-ended operational amplifier, as many be apparent from the circuit configuration method of the present invention.

(Fourth Embodiment)

Figure 12:
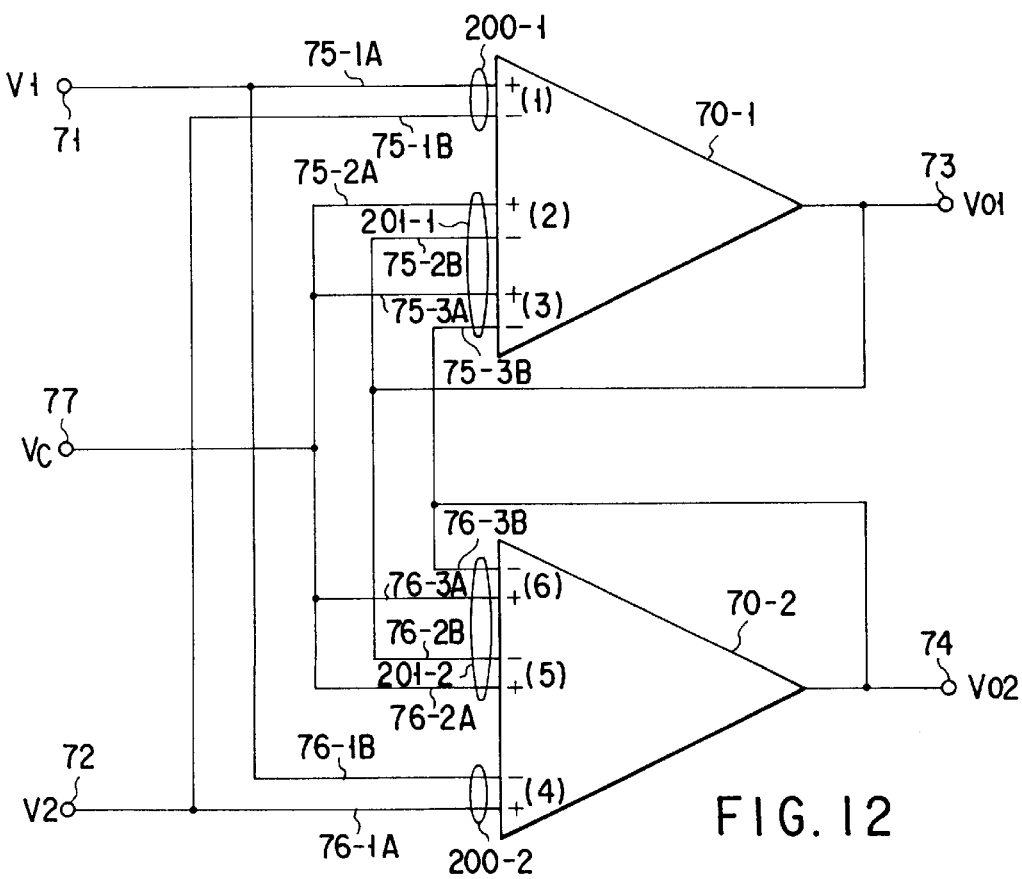
FIG. 12 is a circuit diagram showing the configuration of a balanced Amplifier according to still another embodiment of the present invention.

The fourth embodiment of the present invention will be described below with reference to FIG. 12. FIG. 12 shows the configuration of a balanced amplifier circuit according to the fourth embodiment of the present invention. First and second amplifier circuits 70-1 and 70-2 are 6-input single-ended output differential amplifiers each having two differential input terminal pairs and one output terminal. That is, the first amplifier circuit 70-1 has first, second, and third differential input terminal pairs 75-1, 75-2, and 75-3 and a first output terminal 73. The second amplifier circuit 70-2 has fourth, fifth, and sixth differential input terminal pairs 76-1, 76-2, and 76-3 and a second output terminal 74. Each of these differential input terminal pairs 75-1, 75-2, 75-3, 76-1, 76-2, and 76-3 includes a non-inverting input terminal indicated by a reference numeral with suffix A and an inverting input terminal indicated by a reference numeral with suffix B.

The first differential input terminal pair 75-1 of the first amplifier circuit 70-1 is a first differential input terminal group 200-1. The fourth differential input terminal pair 76-1 of the second amplifier circuit 70-2 is a first differential input terminal group 200-2. The second and third differential input terminal pairs 75-2 and 75-3 of the first amplifier circuit 70-1 form a second differential input terminal group 201-1. The fifth and sixth differential input terminal pairs 76-2 and 76-3 of the second amplifier circuit 70-2 form a second differential input terminal group 201-2.

A non-inverting input terminal 75-1A of the first differential input terminal pair 75-1 is connected to an inverting input terminal 76-1B of the fourth differential input terminal pair 76-1. This connecting point is connected to a first input terminal 71. A non-inverting input terminal 76-1A of the fourth differential input terminal pair 76-1 is connected to an inverting input terminal 75-1B of the first differential input terminal pair 75-1. This connecting point is connected to a second input terminal 72. Non-inverting input terminals 75-2A, 75-3A, 76-2A, and 76-3A of the second, third, fifth, and sixth differential input terminal pairs 75-2, 75-3, 76-2, and 76-3 are connected together, and this connecting point is connected to an input terminal 77 to which a predetermined reference voltage $V_c$ is applied. Non-inverting input terminals 75-2B and 76-2B of the second and fifth differential input terminal pairs 75-2 and 76-2 are connected together and also connected to an output terminal 73 of the amplifier circuit 70-1. Non-inverting input terminals 75-3B and 76-3B of the third and sixth differential input terminal pairs 75-3 and 76-3 are connected together and also connected to an output terminal 74 of the amplifier circuit 70-2.

Figure 13A:
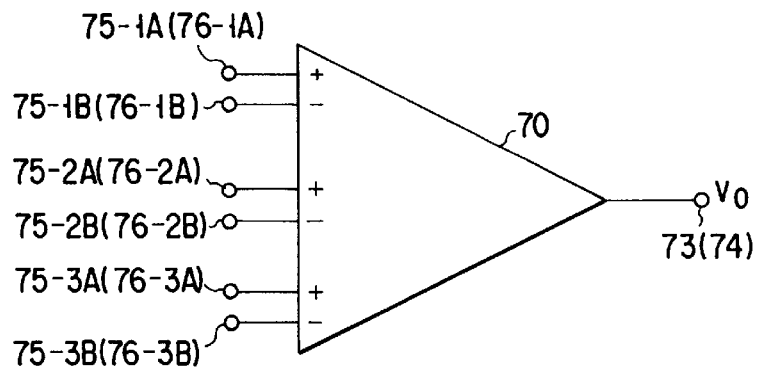
Figure 13B:
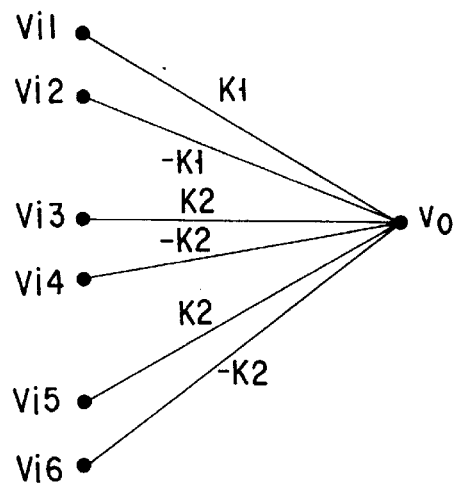

Next, a 6-input single-ended output differential amplifier used as the first and second amplifier circuits 70-1 and 70-2 as the core components of the balanced amplifier according to the present invention will be described below. While an ordinary amplifier handles one differential input voltage, this 6-input single-ended output differential amplifier handles the sum of weighted differential input voltages. FIGS. 13A and 13B are a symbol view and a signal diagram, respectively, of a 6-input single-ended output differential amplifier 70. The transfer function of this 6-input single-ended output differential amplifier is given by $$V01 = K1(s)[Vi1(s) - Vi2(s)] + K2(s)[Vi3(s) - Vi4(s) + Vi5(s) - Vi6(s)]$$

The input stage of this amplifier is highly linearized. In this embodiment shown in FIG. 12, therefore, output voltages $V_{O1}$ and $V_{O2}$ of the output terminals 73 and 74 of the first and second amplifier circuits 70-1 and 70-2 when input voltages $V_1$ and $V_2$ are applied to the first and second input terminals 71 and 72 are given by $$V01(s) = K1(s)[V1(s) - V2(s)] + K2(s)[Vc - V01(s) + Vc - V02(s)]$$

$$V02(s) = K1(s)[V2(s) - V1(s)] + K2(s)[Vc - V02(s) + Vc - V01(s)]$$

Accordingly, an output common-mode voltage $$(V01(s) + V02(s))/2$$

is expressed by $$\frac{V_{01}(s) + V_{02}(s)}{2} = \frac{2K_2(s)}{2K_2(s) + 1} V_c$$

When $K_2(s)$ is much larger than unity, therefore, the output common-mode voltage can be set at $V_c$.

Figure 1A:
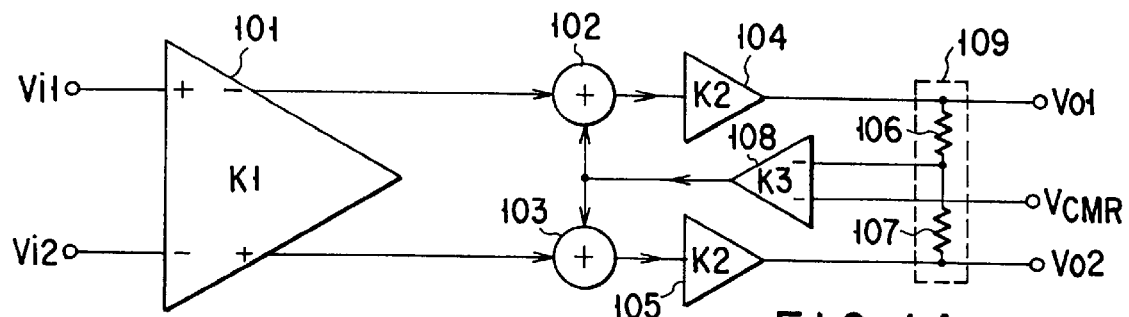
FIGS. 1A and 1B are a circuit diagram of a conventional balanced amplifier and a signal diagram showing the basic operation of the amplifier, respectively.
Figure 1B:
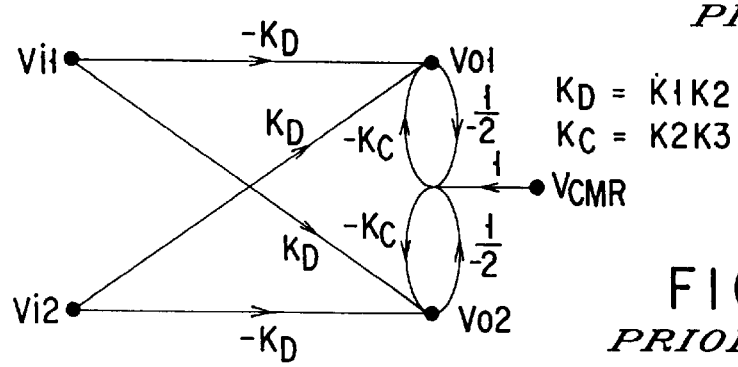

In this embodiment, by comparing in detail the signal diagram shown in FIG. 13B and a signal diagram shown in FIG. 1B of a conventional balanced amplifier, the stable operation condition $K_D = K_C = K$ shown in FIG. 1B can be accomplished by using the two matched amplifier circuits 70-1 and 70-2 as shown in FIG. 12, in which a gain $K_1$ from the first differential input terminal pair to the amplifier circuit output terminal 73 and a gain $K_2$ from the second and third differential input terminal pairs to the amplifier circuit output terminal 73, FIG. 13B, meets a relation $K_1 = 2K_2$. That is, a balanced amplifier can be realized by using two matched 6-input single-ended operational amplifiers. In addition, although the stable operation condition need only be $K_D \leq K_C$, $K_D < K_C$ can also be easily obtained with this configuration.

Also, this embodiment obviates the need for addition of a resistor between output terminals in order to detect an output common-mode voltage in an amplifier with a large output resistance, i.e., a transconductor amplifier. Consequently, the output resistance can be maintained large.

Figure 14:
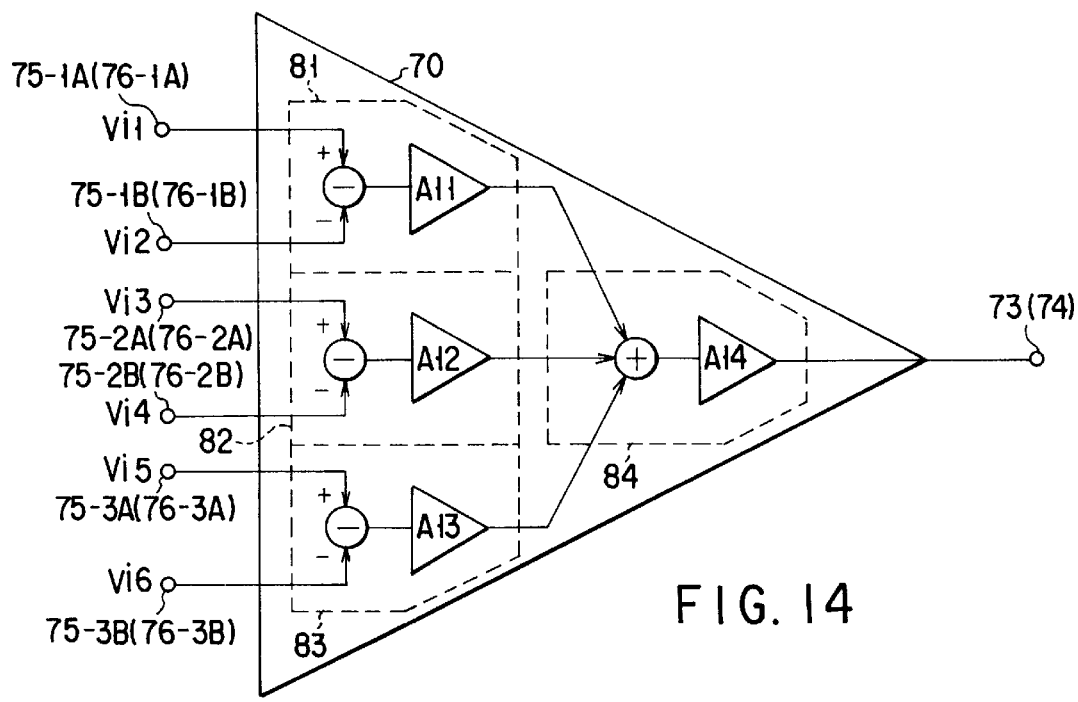
FIG. 14 is a view showing the principle of one example of the 6-input single-ended output differential amplifier.

FIG. 14 shows one example of a method of constituting the single-ended output differential amplifier 70. This amplifier includes a first amplifier unit 81, a second amplifier unit 82, a third amplifier unit 83, and a fourth amplifier unit 84. The first amplifier unit 81 amplifies a difference signal from the first differential input terminal pair, i.e., a difference signal between the non-inverting input terminal 75-1A and the inverting input terminal 75-1B. The second amplifier unit 82 amplifies a difference signal from the second differential input terminal pair, i.e., a difference signal between the non-inverting input terminal 75-2A and the inverting input terminal 75-2B. The third amplifier unit 81 amplifies a difference signal from the third differential input terminal pair, i.e., a difference signal between the non-inverting input terminal 75-3A and the inverting input terminal 75-3B. The fourth amplifier unit 84 amplifies a sum signal of outputs from the first, second, and third amplifier units 81, 82, and 83.

Let A11, A12, A13, and A14 be the gains of the first, second, third, and fourth amplifier units 81, 82, 83, and 84, respectively. Then, the output from this single-ended output differential amplifier 70 is $A14\{A11(V_{i1} - V_{i2}) + A12(V_{i3} - V_{i4}) + A13(V_{i5} - V_{i6})\}$. The relationships with FIG. 13B are $A11 A14 = K_1$ and $A12 A14 = A13 A14 = K_2$.

Figure 15:
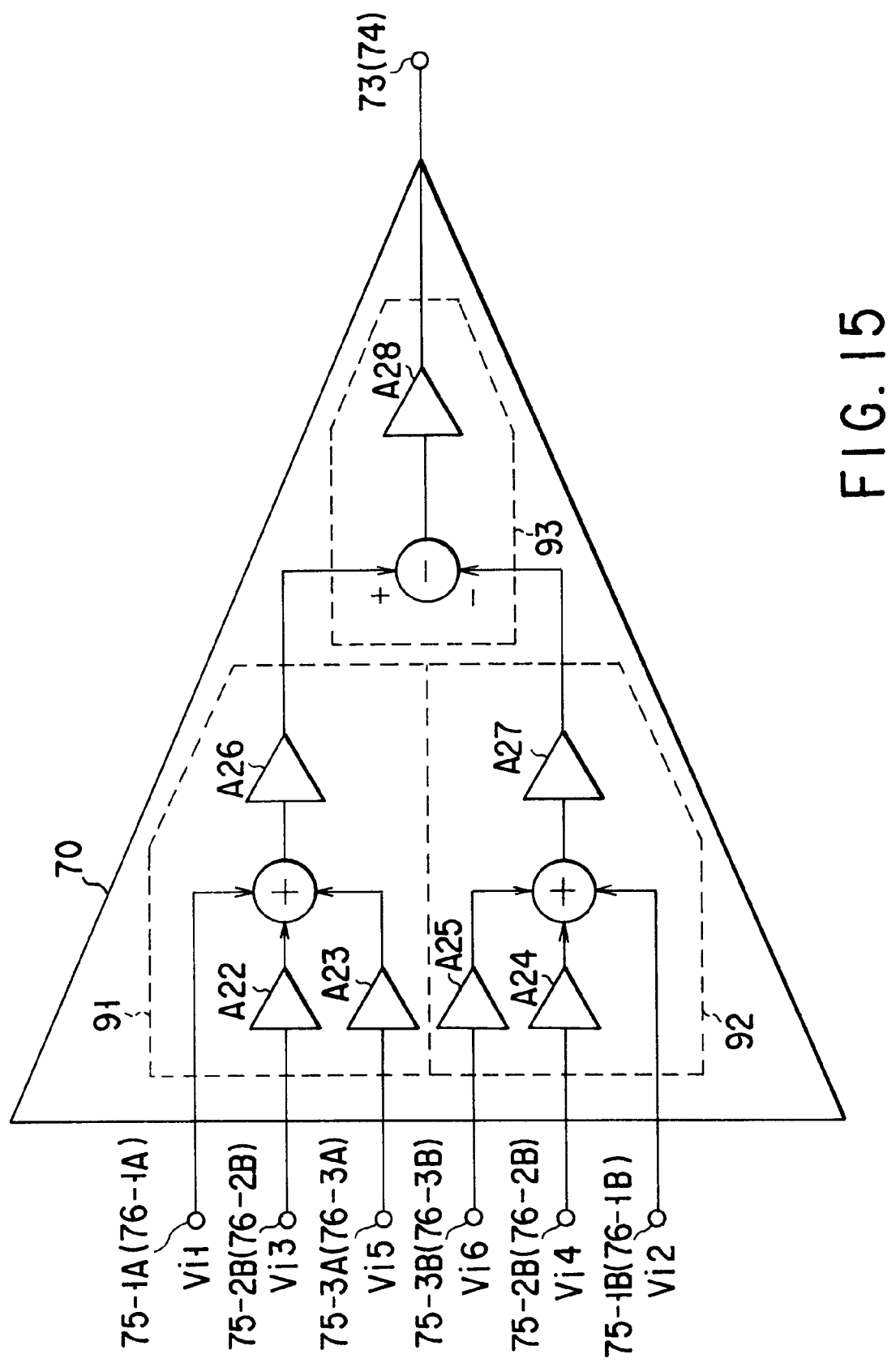
FIG. 15 is a view showing the principle of another example of the 6-input single-ended output differential amplifier.

FIG. 15 shows another example of the method of constituting the single-ended output differential amplifier 70. This amplifier includes a first amplifier unit 91, a second amplifier unit 92, and a third amplifier unit 93. The first amplifier unit 91 amplifies an addition signal of the input signal $V_{i1}$ to the non-inverting input terminal 75-1A of the first differential input terminal pair, A22 times the input signal $V_{i4}$ to the non-inverting input terminal 75-2A of the second differential input terminal pair, and A23 times the input signal $V_{i5}$ to the non-inverting input terminal 75-3A of the third differential input terminal pair. The second amplifier unit 92 amplifies an addition signal of the input signal $V_{i2}$ to the inverting input terminal 75-1B of the first differential input terminal pair, A22 times the input signal $V_{i4}$ to the inverting input terminal 75-2B of the second differential input terminal pair, and A23 times the input signal $V_{i6}$ to the inverting input terminal 75-3B of the third differential input terminal pair. The third amplifier unit 93 amplifies a difference signal of outputs from the first and second amplifier units 91 and 92.

Let A26 and A27 be the gains of the first and second amplifier units 91 and 92 with respect to the sum signals, respectively, and A28 be the gain of the third amplifier unit 93. Then, the output from this single-ended output differential amplifier 70 is $A14\{A28\{A26(V_{i1} + A22V_{i3} + A23V_{i5}) + A27(V_{i2} + A24V_{i4} + A25V_{i6})\}$. The relationships with FIG. 13B are A26A28=A27A28=K$_1$ and A22A26A28= A23A26A28=A24A27A28=A25A27A28=K$_2$.

The balanced amplifier of this embodiment has the advantage that it can be easily designed by the following method.
(Step T1)

Figure 16:
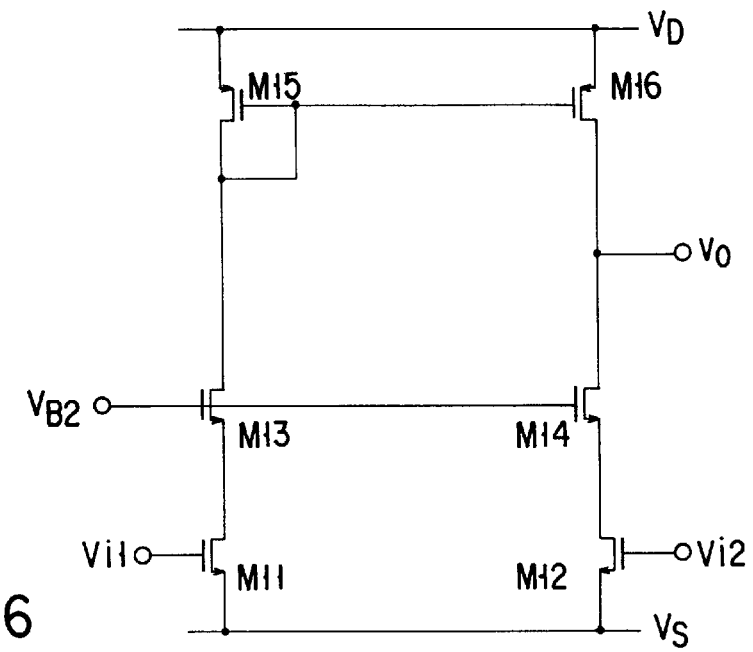
FIG. 16 is a circuit diagram showing another example of an ordinary single-ended operational amplifier.

A single-ended output amplifier is designed, or an appropriate operational amplifier already designed is selected. FIG. 16 shows a circuit example of such an operational amplifier. In this amplifier, transistors M11 and M12 are arranged in the initial stage. Transistors M13 and M14 are gate-grounded transistors. The transistors M11 and M12 are operated in a linear region by appropriately selecting a gate voltage V$_{B2}$, thereby widening the linear input voltage range. An output current from the transistor M13 is returned by a current-mirror circuit including transistors M15 and M16 and added to an output current from the transistor M14.
(Step T2)

Figure 17:
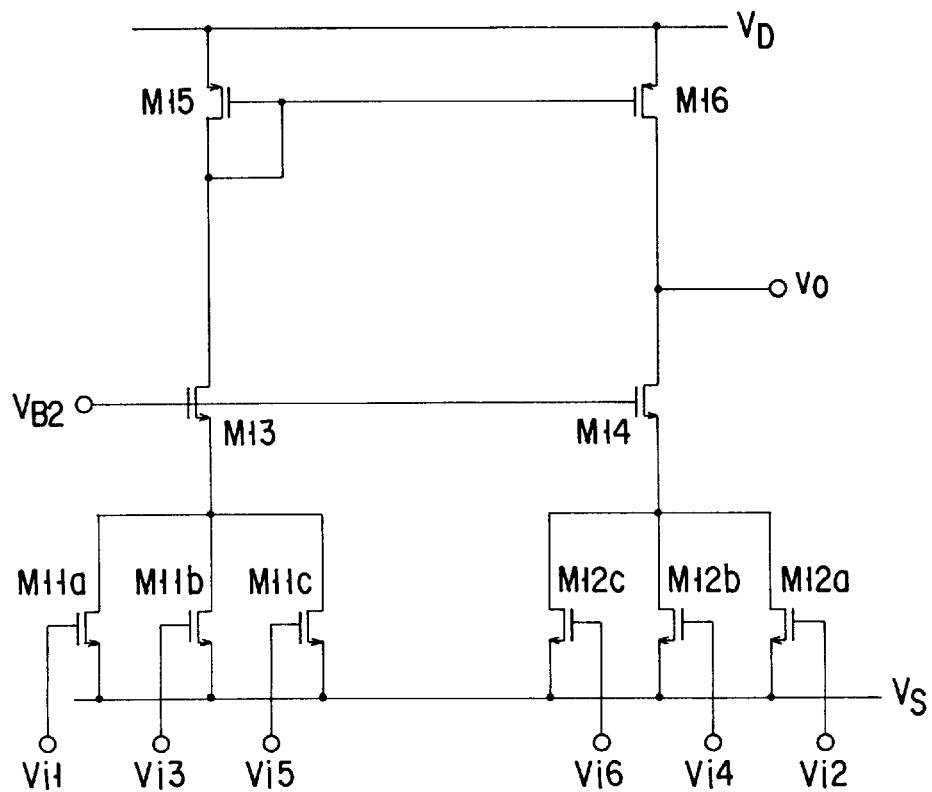
FIG. 17 is a circuit diagram showing a 6-input single-ended output differential amplifier that uses ordinary single-ended operational amplifiers.

To design a 6-input single-ended output amplifier, each of the transistors M11 and M12 in the initial stage of the amplifier circuit designed or chosen in step T1 is divided into three matched transistors as shown in FIG. 17. That is, the gates of the divided transistors are used as new input terminals, and the drain currents of the divided transistors are added by the sources of the transistors M13 and M14. The arrangement of this amplifier is equivalent to A28=1, A22=A23=A24=A25=0.5, and A26=A27=K in FIG. 15.

Note that if the gate width/gate length ratio of the transistors M11 and M12 is W/L in FIG. 16, the gate width/gate length ratio of transistors M11a and M12a is (W/L)/2 and the gate width/gate length ratio of transistors M11b, M12b, M11c, and M12c is (W/L)/4 in FIG. 17.
(Step T3)

Figure 18:
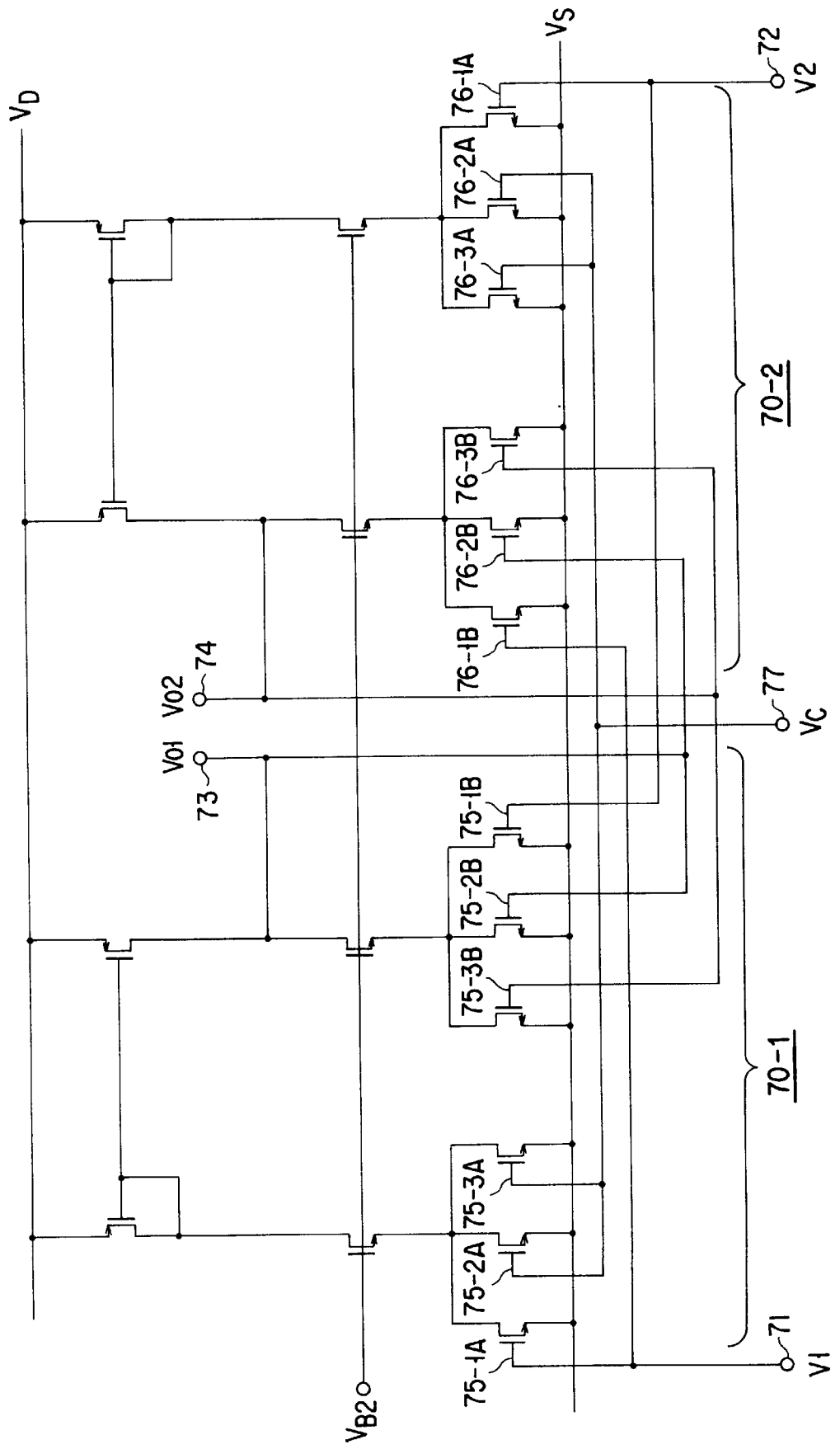
FIG. 18 is a circuit diagram showing the first practical example of the balanced amplifier shown in FIG. 12.

Two single-ended output differential amplifiers shown in FIG. 17 designed in step T2 and having equal characteristics, i.e., matched to each other are prepared and connected as shown in FIG. 18. This configuration shown in FIG. 18 is a practical example of the balanced amplifier according to this embodiment shown in the circuit diagram of FIG. 12.

Accordingly, the following conclusions are introduced.

(1) A single-ended operational amplifier with any circuit configuration can be converted into a balanced amplifier following the procedures in steps T1 to T3 described above.

(2) Unlike the circuit configuration disclosed in Reference 2, the present invention has no extra items to be taken into consideration.

(3) The conditions required for a common-mode signal amplifier circuit to properly operate are automatically met provided that all elements to be symmetrical are well matched in the circuit configuration of the present invention.

In an application in which the gain-bandwidth product GBW$_C$ of the common-mode signal path must be much larger than the gain-bandwidth product GBW$_D$ of the differential signal path, however, it is necessary to increase the gate width/gate length ratio of the transistors connected to the input terminal pairs 75-2, 75-3, 76-2, and 76-3 used for common-mode signal feedback in FIG. 18.

Figure 19A:
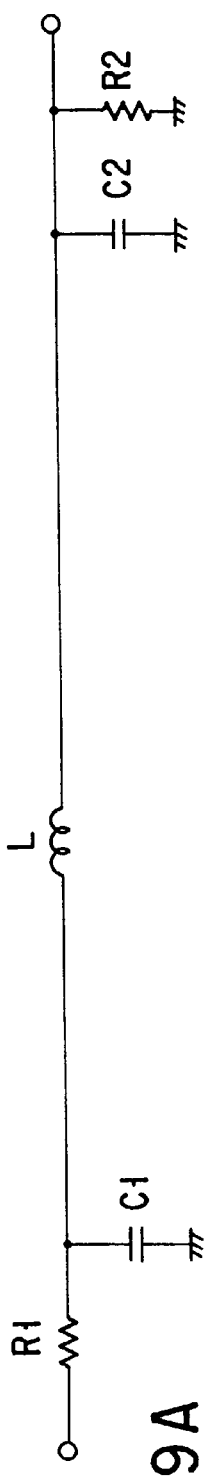
Figure 19B:
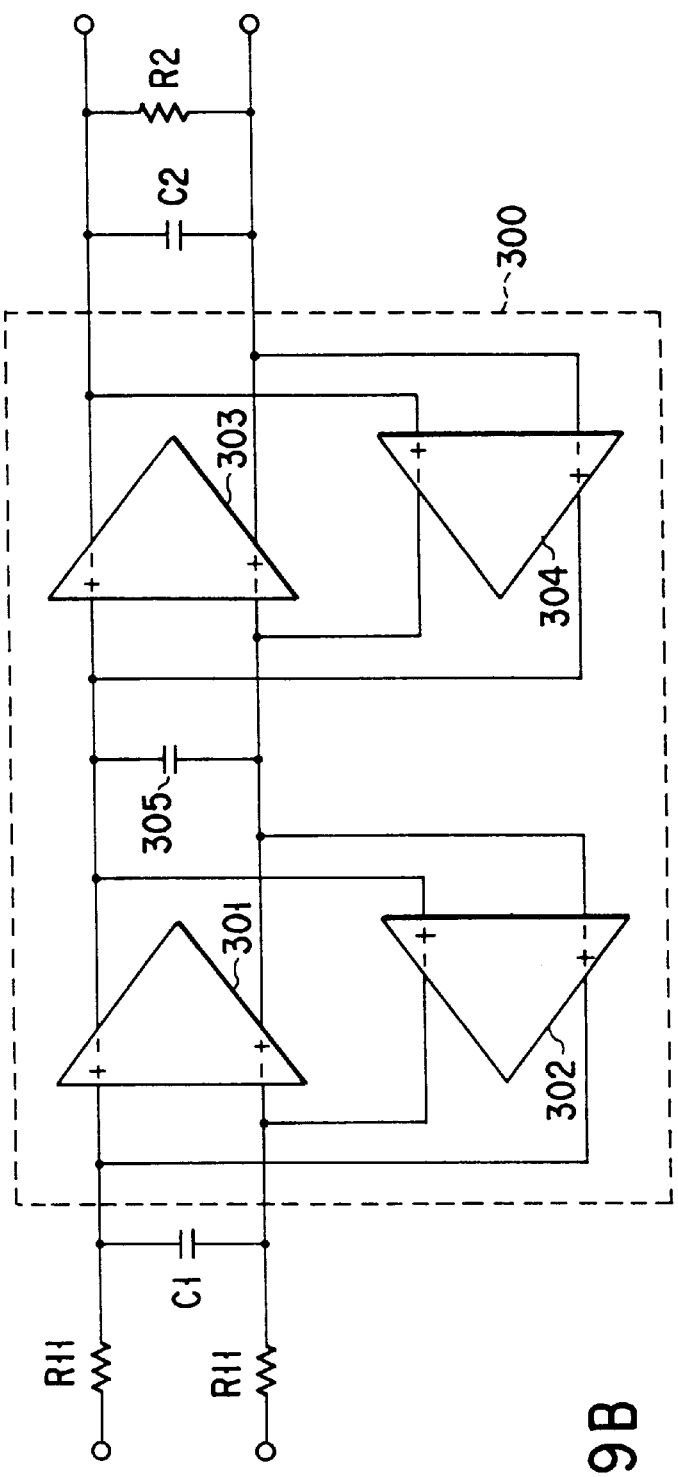

An example of the configuration of a balanced active filter using the balanced amplifier designed as above will be described below with reference to FIGS. 19A and 19B. FIG. 19A is an equivalent circuit diagram of a balanced active filter (LCR filter) including resistances R1 and R2, capacitances C1 and C2, and an inductance L. FIG. 19B is a circuit diagram when the circuit shown in FIG. 19A uses the balanced amplifier of this embodiment. The inductance L of the LCR filter shown in FIG. 19A is realized by a circuit 300 using transconductor amplifiers 301, 302, 303, and 304 and a capacitance 305.

In each of the above embodiments, a MOSFET is used as an element constituting the single-ended operational amplifier as a prototype. However, an active element constituting the single-ended operational amplifier is not limited to a MOSFET. That is, it is possible to apply any element, such as a bipolar transistor, a junction FET, a gallium-arsenic MESFET, or a vacuum tube, capable of constituting a single-ended operational amplifier, as may be obvious from the circuit configuration method of the present invention.

In the present invention as has been described above, very high symmetry can be easily maintained between the differential signal path and the common-mode signal path. Therefore, a large CMRR which is difficult to maintain in conventional arrangements can be ensured over the whole operating band of a differential signal. Additionally, phase compensation design of the path can be executed with no particular difficulty. Consequently, a high-performance balanced amplifier can be readily accomplished.

Also, in the present invention it is possible from an already designed single-ended operational amplifier having known specifications and performance to design a balanced amplifier having nearly the same performance as this single-ended operational amplifier. Since the design procedure is simple and systematic, the balanced amplifier can be completely designed within a very short time. Additionally, the layout design of a balanced amplifier is possible by slight changes if there is the layout design of a conventional single-ended operational amplifier.

As described above, the present invention is economically very useful because balanced amplifiers meeting desired specifications can be designed within short time periods by using conventional design resources.

Furthermore, a single ended-balanced converter and a balanced-single ended converter can be realized by using the balanced amplifier of the present invention. Therefore, when these converters are arranged in input and output units, analog signal processing can be performed in a balanced mode inside a whole LSI. For example, a filter is a basic block of analog signal processing, and this filter can also be implemented using the balanced amplifier of the present invention. Consequently, it is possible to realize a system which is very robust against noise or interference mixing via a power supply or an LSI substrate.

Also, in the present invention very high symmetry can be easily maintained between the differential signal path and the common-mode signal path. Therefore, a large common-mode signal reject ratio which is difficult to maintain in conventional arrangements can be ensured over the whole operating band of a differential signal. Additionally, phase compensation design of the path can be executed with no particular difficulty. Consequently, a high-performance balanced amplifier can be readily accomplished.

The present invention obviates the need for addition of a resistor between output terminals in order to detect an output common-mode voltage in an amplifier with a large output resistance, i.e., a transconductor amplifier. Therefore, the output resistance can be kept large.

The output resistance of an amplifier used in an integrator as one component of a filter produces a loss. However, large output resistance can be maintained when the amplifier of the present invention is used. Accordingly, an integrator with a small loss can be accomplished.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A balanced amplifier comprising:
a first multi-input single-ended output differential amplifier having a first differential input terminal pair to receive an externally applied first differential input signal, a second differential input terminal pair, and a first output terminal;
a second multi-input single-ended output differential amplifier having a third differential input terminal pair to receive an externally applied second differential input signal, a fourth differential input terminal pair, and a second output terminal; and
a feedback circuit including impedance elements for connecting said first, second, third and fourth differential input pairs and said first and second output terminals,
wherein said first and second multi-input single-ended output differential amplifiers have matched characteristics.

2. A balanced amplifier comprising:
a first amplifier circuit having first and second differential input terminal pairs and a first output terminal; and
a second amplifier circuit having third and fourth differential input terminal pairs and a second output terminal,
wherein an inverting input terminal of said first differential input terminal pair and a non-inverting input terminal of said third differential input terminal pair are connected to form a first node, and said first node is connected to a first input terminal of said balanced amplifier,
a non-inverting input terminal of said first differential input terminal pair and an inverting input terminal of said third differential input terminal pair are connected to form a second node, and said second node is connected to a second input terminal of said balanced amplifier,
a non-inverting input terminal of said second differential input terminal pair and a non-inverting input terminal of said fourth differential input terminal pair are connected to form a third node, and
an inverting input terminal of said second differential input terminal pair and an inverting input terminal of said fourth differential input terminal pair are connected to form a fourth node, and
said balanced amplifier further comprises a feedback circuit for performing feedback from said first and second output terminals to said first to fourth nodes.

3. An amplifier according to claim 2, wherein said feedback circuit comprises a first feedback path for performing feedback from said first and second output terminals to said first and second nodes, and a second feedback path for performing feedback from said first and second output terminals to said third and fourth nodes.

4. An amplifier according to claim 3, wherein said first feedback path comprises impedance elements respectively connected between said first and second output terminals and said first and second nodes.

5. An amplifier according to claim 3, wherein said second feedback path comprises a voltage divider having two terminals respectively connected to said first and second output terminals and a voltage-dividing point connected to said fourth node.

6. An amplifier according to claim 2, wherein each of said first and second amplifier circuits comprises:
a first amplifier for amplifying a difference signal from said first or third differential input terminal pair;
a second amplifier for amplifying a difference signal from said second or fourth differential input terminal pair; and
a third amplifier for amplifying a sum signal of outputs from said first and second amplifiers.

7. An amplifier according to claim 2, wherein each of said first and second amplifier circuits comprises:
a first amplifier for amplifying a sum signal of an inverting input terminal of said first or third differential input terminal pair and an inverting input terminal of said second or fourth differential input terminal pair;
a second amplifier for amplifying a sum signal of a non-inverting input terminal of said first or third differential input terminal pair and a non-inverting input terminal of said second or fourth differential input terminal pair; and
a third amplifier for amplifying a difference signal of outputs from said first and second amplifiers.

8. An amplifier according to claim 6, wherein each of said first and second amplifiers comprises a voltage/current converter for converting differential input voltage signals to differential current signals, and
said third amplifier comprises an adder for adding the differential current signals from said first and the second amplifiers and an output stage for amplifying and supplying the result of addition by said adder to said first or second output terminals.

9. A filter using an amplifier according to claim 2.

10. A balanced amplifier comprising:
a first amplifier circuit having first and second differential input terminal pairs and a first output terminal; and
a second amplifier circuit having third and fourth differential input terminal pairs and a second output terminal,
wherein non-inverting terminals of said first and third differential input terminal pairs are connected to first and second input terminals of said balanced amplifier,
an inverting input terminal of said second differential input terminal pair and a non-inverting input terminal of said fourth differential input terminal pair are connected to form a first node,
a non-inverting input terminal of said second differential input terminal pair and an inverting input terminal of said fourth differential input terminal pair are connected to form a second node, and
said balanced amplifier further comprises:
first and second impedance elements connected in series between said first and second nodes;
a third impedance element connected between said first node and said first output terminal;
a fourth impedance element connected between said second node and said second output terminal; and
a third amplifier circuit having an input terminal connected to a connecting point of said first and second impedance elements and an output terminal negatively fed back to said first and third inverting input terminal pairs.

11. An amplifier according to claim 10, wherein each of said first and second amplifier circuits comprises:
a first amplifier for amplifying a difference signal from said first or third differential input terminal pair;
a second amplifier for amplifying a difference signal from said second or fourth differential input terminal pair; and a third amplifier for amplifying a sum signal of outputs from said first and second amplifiers.

12. An amplifier according to claim 10, wherein each of said first and second amplifier circuits comprises:

a first amplifier for amplifying a sum signal of an inverting input terminal of said first or third differential input terminal pair and an inverting input terminal of said second or fourth differential input terminal pair;

a second amplifier for amplifying a sum signal of a non-inverting input terminal of said first or third differential input terminal pair and a non-inverting input terminal of said second or fourth differential input terminal pair; and a third amplifier for amplifying a difference signal of outputs from said first and second amplifiers.

13. An amplifier according to claim 11, wherein each of said first and second amplifiers comprises a voltage/current converter for converting differential input voltage signals to differential current signals, and said third amplifier comprises an adder for adding the differential current signals from said first and the second amplifiers and an output stage for amplifying and supplying the result of addition by said adder to said first or second output terminals.

14. A filter using an amplifier according to claim 10.

15. A balanced amplifier comprising:

a first multi-input single-ended output differential amplifier having a first differential input terminal group including at least one differential input terminal pair to receive an externally supplied first differential input signal, a second differential input terminal group including plural differential input terminal pairs, and a first output terminal;

a second multi-input single-ended output differential amplifier having a third differential input terminal group including at least one differential input terminal pair to receive an externally supplied second differential input signal, a fourth differential input terminal group including plural differential input terminal pairs, and a second output terminal; and a connecting circuit for connecting input terminals of said second and fourth differential input terminal groups and said first and second output terminals, wherein said first and second multi-input single-ended output differential amplifiers have matched characteristics.

16. A balanced amplifier comprising:

a first amplifier circuit having first, second, and third differential input terminal pairs and a first output terminal; and a second amplifier circuit having fourth, fifth, and sixth differential input terminal pairs and a second output terminal, wherein a non-inverting input terminal of said first differential input terminal pair and an inverting input terminal of said fourth differential input terminal pair are connected to form a first node, and said first node is connected to a first input terminal of said balanced amplifier, an inverting input terminal of said first differential input terminal pair and a non-inverting input terminal of said fourth differential input terminal pair are connected to form a second node, and said second node is connected to a second input terminal of said balanced amplifier, a non-inverting input terminal of said second differential input terminal pair, a non-inverting input terminal of said third differential input terminal pair, a non-inverting input terminal of said fifth differential input terminal pair, and a non-inverting input terminal of said sixth differential input terminal pair are connected to form a third node, and said third node is applied with a predetermined voltage, an inverting input terminal of said second differential input terminal pair and an inverting input terminal of said fifth differential input terminal pair are connected to said second output terminal, and an inverting input terminal of said third differential input terminal pair and an inverting input terminal of said sixth differential input terminal pair are connected to said first output terminal.

17. An amplifier according to claim 16, wherein transconductance from said first differential input terminal pair to said first output terminal of said first amplifier circuit and transconductance from said fourth differential input terminal pair to said second output terminal of said second amplifier circuit are substantially equal, and transconductance from said second differential input terminal pair to said first output terminal of said first amplifier circuit, transconductance from said third differential input terminal pair to said first output terminal of said first amplifier circuit, transconductance from said fifth differential input terminal pair to said second output terminal of said second amplifier circuit, and transconductance from said sixth differential input terminal pair to said second output terminal of said second amplifier circuit are substantially equal.

18. An amplifier according to claim 16, wherein transconductance from said first differential input terminal pair to said first output terminal of said first amplifier circuit is substantially twice transconductance from said second differential input terminal pair to said first output terminal of said first amplifier circuit.

* * * * *